(12) United States Patent
Ito et al.

(10) Patent No.: US 9,229,046 B2
(45) Date of Patent: Jan. 5, 2016

(54) SEMICONDUCTOR DEVICE

(71) Applicant: Renesas Electronics Corporation, Kawasaki-shi, Kanagawa (JP)

(72) Inventors: Kazuyuki Ito, Kanagawa (JP); Hiroshi Shirota, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 116 days.

(21) Appl. No.: 14/077,277

(22) Filed: Nov. 12, 2013

(65) Prior Publication Data

US 2014/0152334 A1    Jun. 5, 2014

(30) Foreign Application Priority Data

Nov. 30, 2012    (JP) ................................ 2012-262826

(51) Int. Cl.
*G01R 31/00*    (2006.01)
*G01R 31/27*    (2006.01)
(Continued)

(52) U.S. Cl.
CPC .......... *G01R 31/27* (2013.01); *G01R 31/31703* (2013.01); *G01R 31/31725* (2013.01); *H03K 3/0375* (2013.01)

(58) Field of Classification Search
CPC .................. G01R 31/31928; G01R 31/31932; G01R 31/31937; G01R 31/31708; G01R 31/31725; G01R 31/31816; G01R 31/318541; G01R 31/318544; G01R 31/31922; G01R 31/3191; G01R 31/2886; G01R 35/005; G01R 35/00; G01R 1/06705; G06F 17/505
USPC ......... 324/537, 555, 750.01–750.03
See application file for complete search history.

(56) References Cited

U.S. PATENT DOCUMENTS 5,815,512 A * 9/1998 Osawa ........... G01R 31/318541
                                                          365/201
6,092,217 A * 7/2000 Kanekawa ............... G05B 9/03
                                                          714/11
6,374,392 B1 * 4/2002 Ochiai ............. G01R 31/31928
                                                          714/744

(Continued)

FOREIGN PATENT DOCUMENTS

JP    2007-302941    * 11/2007
JP    2008-42367    * 2/2008

(Continued)

OTHER PUBLICATIONS

Extended European search report issued Mar. 21, 2014, in European Patent Application No. 13190845.1.

*Primary Examiner* — Patrick Assouad
*Assistant Examiner* — Sean Curtis
(74) *Attorney, Agent, or Firm* — Miles & Stockbridge P.C.

(57) ABSTRACT

If an exclusive OR circuit itself, a component of a signal delay detecting circuit, has failed to operate properly, a signal delay cannot be detected accurately. A malfunction pre-detecting circuit 12 includes a delay circuit DL to delay input data that is input in parallel to a data input terminal of a flip-flop FF1 provided in a subsequent stage of a flip-flop FF0, a flip-flop FFT that receives output of the delay circuit DL, and a comparator CMP that compares output of the flip-flop FF1 and output of the flip-flop FFT. Test data tv1 and test data tv2 are input to the malfunction pre-detecting circuit 12 in an operation test mode for testing operation of the malfunction pre-detecting circuit 12. The test data tv2 is input to the delay circuit DL. The comparator CMP compares the test data tv1 and output of the flip-flop FFT in the operation test mode.

18 Claims, 15 Drawing Sheets

(51) Int. Cl.
*G01R 31/317* (2006.01)
*H03K 3/037* (2006.01)

(56) References Cited

U.S. PATENT DOCUMENTS

| | | | | |
|---|---|---|---|---|
| 6,621,297 B2* | 9/2003 | Watanabe | ............ | H03K 19/1736 326/26 |
| 6,693,436 B1* | 2/2004 | Nelson | ............ | G01R 31/31922 324/537 |
| 6,750,672 B2* | 6/2004 | Tanimura | ............ | G01R 31/2882 324/754.09 |
| 7,126,366 B2* | 10/2006 | Ohashi | ............ | G01R 31/3191 324/363 |
| 7,135,880 B2* | 11/2006 | Negishi | ............ | G01R 31/3928 324/750.01 |
| 7,196,534 B2* | 3/2007 | Oshima | ............ | G01R 31/31932 324/762.01 |
| 7,197,682 B2* | 3/2007 | Niijima | ............ | G01R 31/31725 714/700 |
| 7,216,315 B2* | 5/2007 | Yoshida | ............ | G06F 17/5022 324/523 |
| 7,286,950 B2* | 10/2007 | Ozora | ............ | G01R 31/319 702/108 |
| 7,330,045 B2* | 2/2008 | Oshima | ............ | G01R 31/31932 324/762.01 |
| 7,332,926 B2* | 2/2008 | Ohashi | ............ | G01R 31/3191 324/762.01 |
| 7,444,569 B2* | 10/2008 | Shidei | ............ | G01R 31/318541 714/727 |
| 7,592,797 B2* | 9/2009 | Fujieda | ............ | G01R 31/31721 324/750.01 |
| 7,733,113 B2* | 6/2010 | Narikawa | ............ | G01R 31/31937 324/73.1 |
| 7,834,639 B2* | 11/2010 | Ichiyama | ............ | G01R 31/31709 324/537 |
| 7,848,169 B2* | 12/2010 | Shikata | ............ | G11C 29/021 365/194 |
| 7,853,844 B2* | 12/2010 | Sasagawa | ............ | G01R 31/31708 714/25 |
| 7,893,744 B2* | 2/2011 | Nakamura | ............ | G06F 1/08 327/172 |
| 7,925,944 B2* | 4/2011 | Hirose | ............ | G11C 29/003 324/537 |
| 7,937,633 B2* | 5/2011 | Takasugi | ............ | G11C 29/48 714/718 |
| 7,970,565 B2* | 6/2011 | Hou | ............ | G01R 31/31937 324/121 R |
| 8,028,210 B2* | 9/2011 | Kurimoto | ............ | G01R 31/31858 324/535 |
| 8,270,225 B2* | 9/2012 | Watanabe | ............ | G01R 31/3191 365/189.05 |
| 8,278,961 B2* | 10/2012 | Watanabe | ............ | G01R 29/027 324/762.01 |
| 2004/0031008 A1* | 2/2004 | Satoh | ............ | G06F 17/5022 716/113 |
| 2007/0271057 A1* | 11/2007 | Shiroyama | ............ | G01R 31/31717 702/117 |
| 2007/0283203 A1* | 12/2007 | Hayashi | ............ | G01R 31/318583 714/724 |
| 2010/0100779 A1* | 4/2010 | Moriya | ............ | G11C 29/023 714/718 |
| 2010/0201344 A1* | 8/2010 | Kim | ............ | H03K 3/0375 324/76.77 |
| 2011/0012612 A1* | 1/2011 | Iwamoto | ............ | G01R 31/31932 324/537 |
| 2011/0022909 A1* | 1/2011 | Wang | ............ | G01R 31/31816 714/726 |
| 2011/0187400 A1* | 8/2011 | Watanabe | ............ | G01R 31/31928 324/756.02 |
| 2011/0202804 A1* | 8/2011 | Sunter | ............ | G01R 31/3177 714/726 |
| 2011/0320994 A1* | 12/2011 | Nakamura | ............ | G06F 17/505 716/114 |
| 2012/0068749 A1* | 3/2012 | Sood | ............ | G06F 17/505 327/202 |

FOREIGN PATENT DOCUMENTS

| | | | |
|---|---|---|---|
| JP | 2008-042367 A | | 2/2008 |
| JP | 2008042367 A | * | 2/2008 |
| JP | 2008-256491 A | | 10/2008 |

* cited by examiner

SEMICONDUCTOR DEVICE

CROSS-REFERENCE TO RELATED APPLICATIONS

The disclosure of Japanese Patent Application No. 2012-262826 filed on Nov. 30, 2012 including the specification, drawings and abstract is incorporated herein by reference in its entirety.

BACKGROUND

The present invention relates to semiconductor devices, in particular, a semiconductor device having a function of detecting a malfunction risk caused by, e.g., a signal delay due to temperature rise.

Occasionally, any malfunction may occur in a circuit within a semiconductor device, causing a low resistive short circuit between power supply and ground. In consequence, temperature rises, causing delay in signal transfer in internal circuits.

In order to detect such a signal delay, a signal delay detecting circuit described in, e.g., Patent Document 1 (Japanese Published Unexamined Patent Application No. 2008-256491) includes one or more delay detecting units, each having at least one signal propagation delay circuit (1) and an exclusive OR circuit (C) that receives a signal (B) output from the signal propagation delay circuit (1) and a signal C passed through a signal transfer path branching off from an input section of the signal propagation delay circuit (1) and outputs a signal. Using a digital signal that is output from the exclusive OR circuit (C), a determination is made as to whether or not the signal propagation delay circuit (1) behaves abnormally.

RELATED ART DOCUMENT

Patent Document

[Patent Document 1] Japanese Published Unexamined Patent Application No. 2008-256491

SUMMARY

In Patent Document 1, however, there is a problem in which, if the exclusive OR circuit (C) itself, a component of the signal delay detecting circuit, has failed to operate properly, a signal delay cannot be detected accurately.

Also, in Patent Document 1, a configuration for detecting a signal delay between two flip-flops is not disclosed.

Other problems and novel features will become apparent from the following description in the present specification and the accompanying drawings.

According to one embodiment of the present invention, a malfunction pre-detecting circuit includes a delay element to delay input data that is input in parallel to a data input terminal of a second flip-flop which is provided in a subsequent stage of a first flip-flop, a third flip-flop that receives output of the delay element, and a comparator that compares output of the second flip-flop and output of the third flip-flop. First test data and second test data are input to the malfunction pre-detecting circuit in an operation test mode for testing operation of the malfunction pre-detecting circuit and the second test data is input to the delay element. The comparator compares the first test data and output of the third flip-flop in the operation test mode.

According to one embodiment of the present invention, it is possible to detect the failure of a circuit itself for detecting a signal delay and, therefore, a signal delay due to over-temperature or the like can be detected accurately.

DETAILED DESCRIPTION

In the following, embodiments of the present invention will be described by way of the drawings.
First Embodiment FIG. 1 is a diagram depicting a configuration of a part of a microcomputer of a first embodiment.

Figure 1:
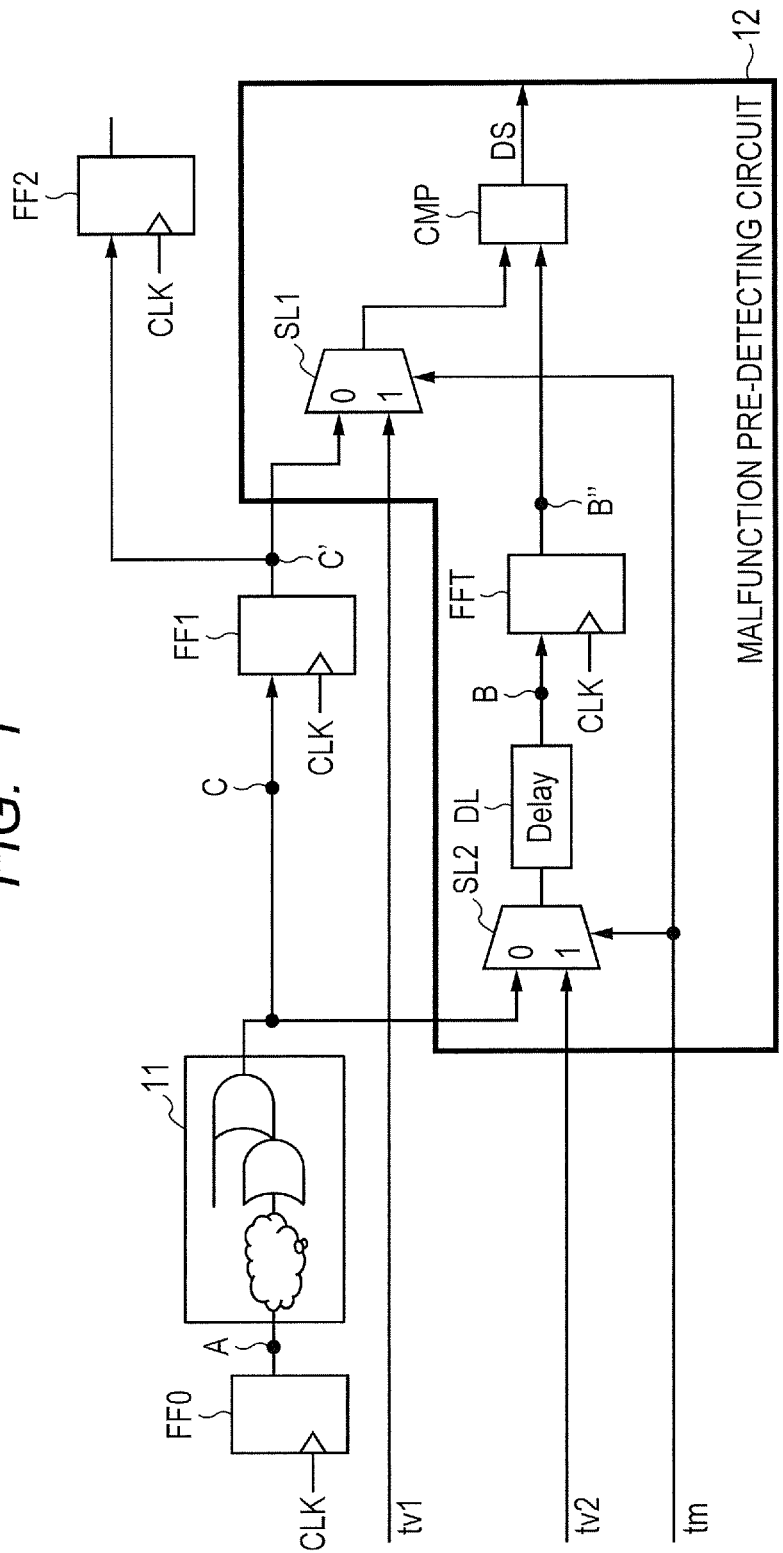
FIG. 1 is a diagram depicting a configuration of a part of a microcomputer of a first embodiment.

Referring to FIG. 1, the microcomputer has a flip-flop FF0, a logic circuit 11, a flip-flop FF1, and a flip-flop FF2 which serve as a functional circuit.

The microcomputer 1 has a malfunction pre-detecting circuit 12 provided on a route branching off from a route between the flip-flop FF0 and the flip-flop FF1. The malfunction pre-detecting circuit 12 has a delay-side path that is comprised of a selector SL2, a delay circuit DL1, and a flip-flop FFT, a reference-side path through a selector SL1, and a comparator CMP that compares both signals from the delay-side path and the reference-side path.

The flip-flop FF0 has a data input terminal to which real data is input in usual operation mode, an input terminal to which a clock CLK is input, and an output terminal.

The logic circuit 11 receives data that is output from the output terminal of the flip-flop FF0 and performs logical operation of the data among others.

Output of the logic circuit 11 branches into two routes, one of which is coupled to the flip-flop FF1 and the other of which is coupled to the selector SL2 in the malfunction pre-detecting circuit 12.

The flip-flop FF1 has a data input terminal that receives output of the logic circuit 11 in usual operation mode, a clock terminal to which the clock CLK is input, and an output terminal.

Output of the flip-flop FF1 branches into two routes, one of which is coupled to the flip-flop FF2 and the other of which is coupled to the selector SL1 in the malfunction pre-detecting circuit 12.

The flip-flop FF2 has a data input terminal that receives output of the flip-flop FF1 in usual operation mode, a clock terminal to which the clock CLK is input, and an output terminal.

The selector SL2 receives data output from the logic circuit 11 and test data tv2. The selector SL2 outputs the test data tv2 to the delay circuit DL, when a test mode signal tm is activated. The selector SL2 outputs the data output from the logic circuit 11 to the delay circuit DL, when the test mode signal tm is deactivated.

The delay circuit DL delays an output signal of the selector SL2. An amount of delay made by the delay circuit DL is set to a value by which the comparator CMP can determine that a malfunction occurs in case the operating temperature has become out of an operation guaranteed temperature range.

The flip-flop FFT has a data input terminal that receives output of the delay circuit DL, a clock terminal to which the clock CLK is input, and an output terminal.

The selector SL1 receives data output from the flip-flop FF1 and test data tv1. The selector SL1 outputs the test data tv1 to the comparator CMP, when the test mode signal tm is activated. The selector SL1 outputs the data output from the flip-flop FF1 to the comparator CMP, when the test mode signal tm is deactivated.

The comparator CMP is, for example, an XNOR circuit; it sets a comparison result signal DS to "High" level, when an output signal of the selector SL1 and an output signal of the flip-flop FFT are in phase, and sets the comparison result signal DS to "Low" level, when both output signals are out of phase.

More specifically, in test operation mode, the comparator CMP sets the comparison result signal DS to "High" level, when test data tv1 and test data tv2 passed through the delay circuit DL and the flip-flop FFT are in phase, and sets the comparison result signal DS to "Low" level, when both test data are out of phase.

In usual operation mode, the comparator CMP sets the comparison result signal DS to "High" level, when real data passed through the flip-flop FF1 and real data passed through the delay circuit DL and the flip-flop FFT are in phase, and sets the comparison result signal DS to "Low" level, when both real data are out of phase.

In FIG. 1, the selector SL1 is placed after the flip-flop FF1. This placement of the selector SL1 enables testing the malfunction pre-detection circuit without affecting operation of a path from the flip-flop FF1 to the flip-flop FF2. If it is ensured that no trouble occurs in the operation of the path from the flip-flop FF1 to the flip-flop FF2, the selector SL1 may be placed before the flip-flop FF1 in the same order in which the selector and the flip-flop are placed in the delay-side path.

Figure 2:
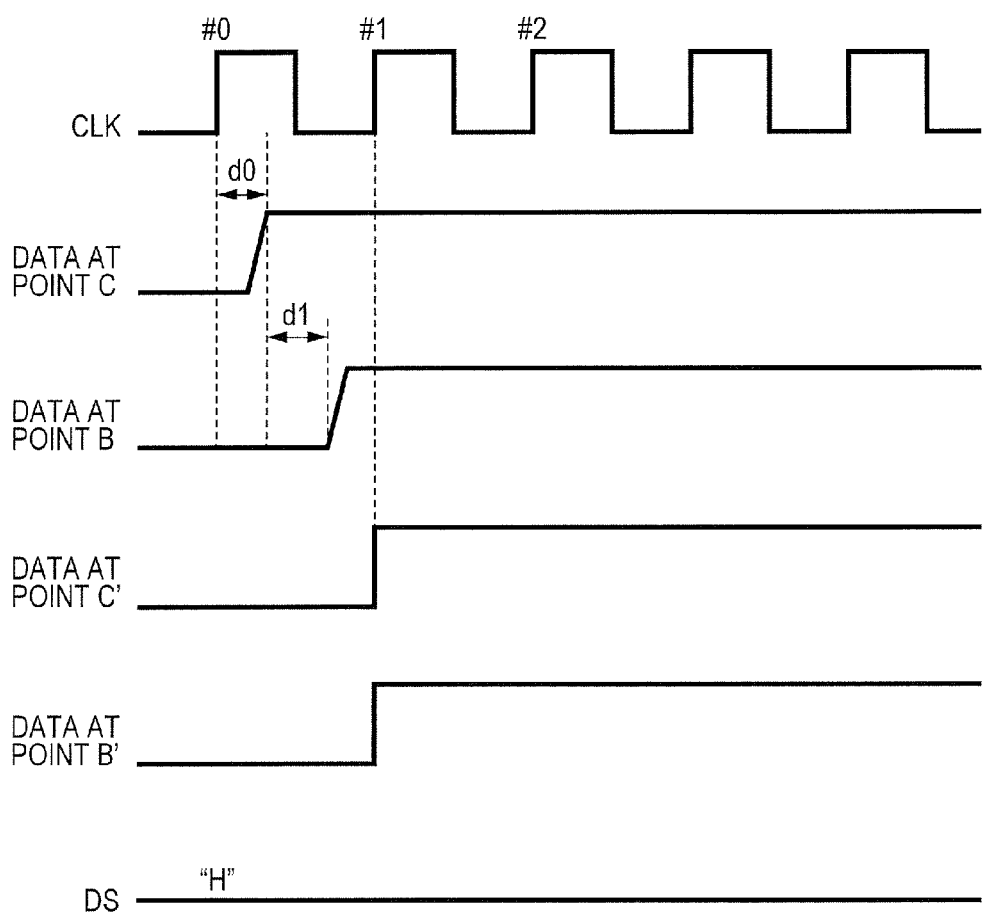
FIG. 2 is a diagram for explaining normal operation in usual operation mode.

FIG. 2 is a diagram for explaining normal operation in usual operation mode.

Referring to FIG. 2, data at point C is input to the data input terminal of the flip-flop FF1. The data at point C lags by a time d0 relative to a rising edge #0 of the clock CLK. The flip-flop FF1 changes its output (data at point C') to "High" level in sync with a rising edge #1 of the clock CLK.

On the other hand, data at point B is input to the data input terminal of the flip-flop FFT. The data at point B lags by a time d1 behind the data at point C, delayed by the delay circuit DL. The flip-flop FFT changes its output (data at point B') to "High" level in synch with the rising edge #1 of the clock CLK.

The comparator CMP compares the data at point C' and the data at point B'. Because the data at point C' and the data at point B' are in phase constantly, the comparison result signal DS remains at "High" level constantly.

Figure 3:
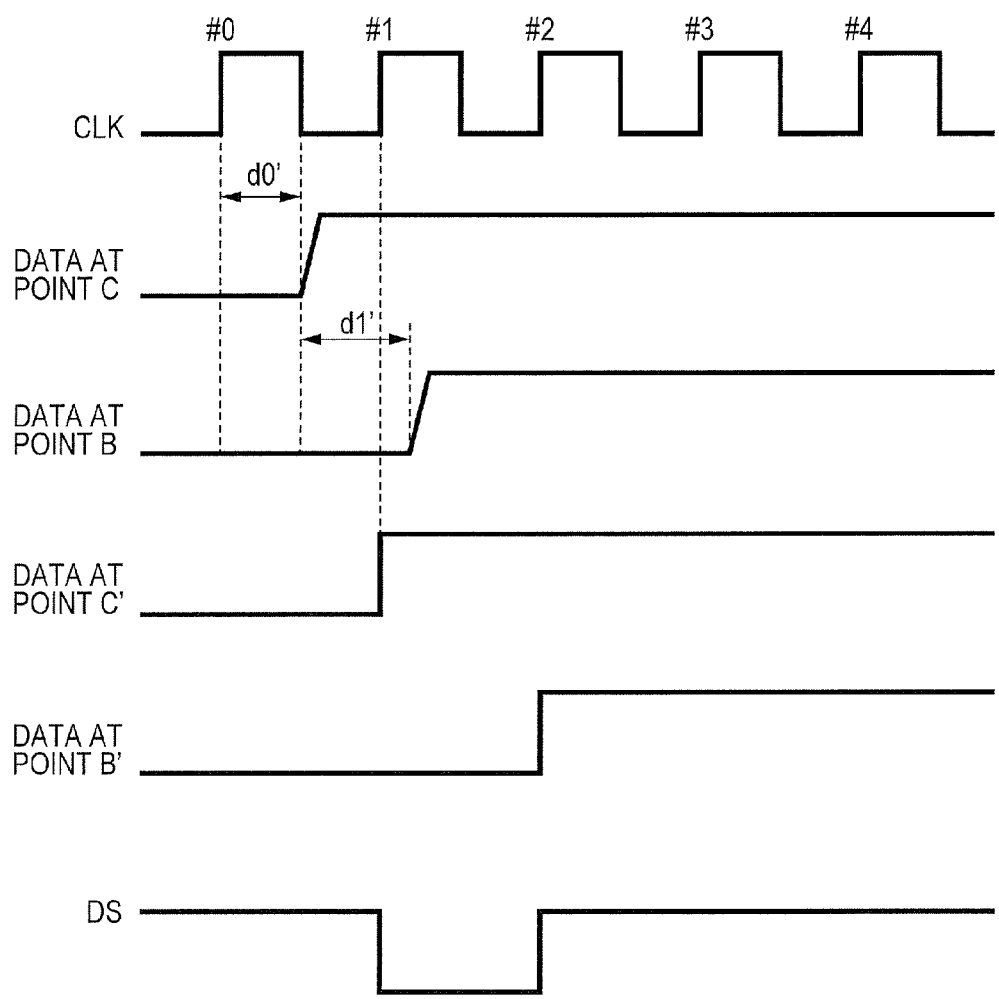
FIG. 3 is a diagram for explaining operation, when a malfunction is pre-detected in usual operation mode.

FIG. 3 is a diagram for explaining operation, when a malfunction is pre-detected in usual operation mode.

Referring to FIG. 3, data at point C is input to the data input terminal of the flip-flop FF1. The data at point C lags by a time d0' relative to a rising edge #0 of the clock CLK. The flip-flop FF1 changes its output (data at point C') to "High" level in sync with a rising edge #1 of the clock CLK.

On the other hand, data at point B is input to the data input terminal of the flip-flop FFT. The data at point B lags by a time d1' behind the data at point C, delayed by the delay circuit DL.

In consequence of that the operating temperature has become out of an operation guaranteed temperature range, the flip-flop FFT changes its output (data at point B') to "High" level in sync with a rising edge #2 of the clock CLK.

The comparator CMP compares the data at point C' and the data at point B' Because the data at point C' and the data at point B' are out of phase for a period from the rising edge #1 to the rising edge #2 of the clock CLK, the comparison result signal DS becomes "Low" level during this period.

Figure 4:
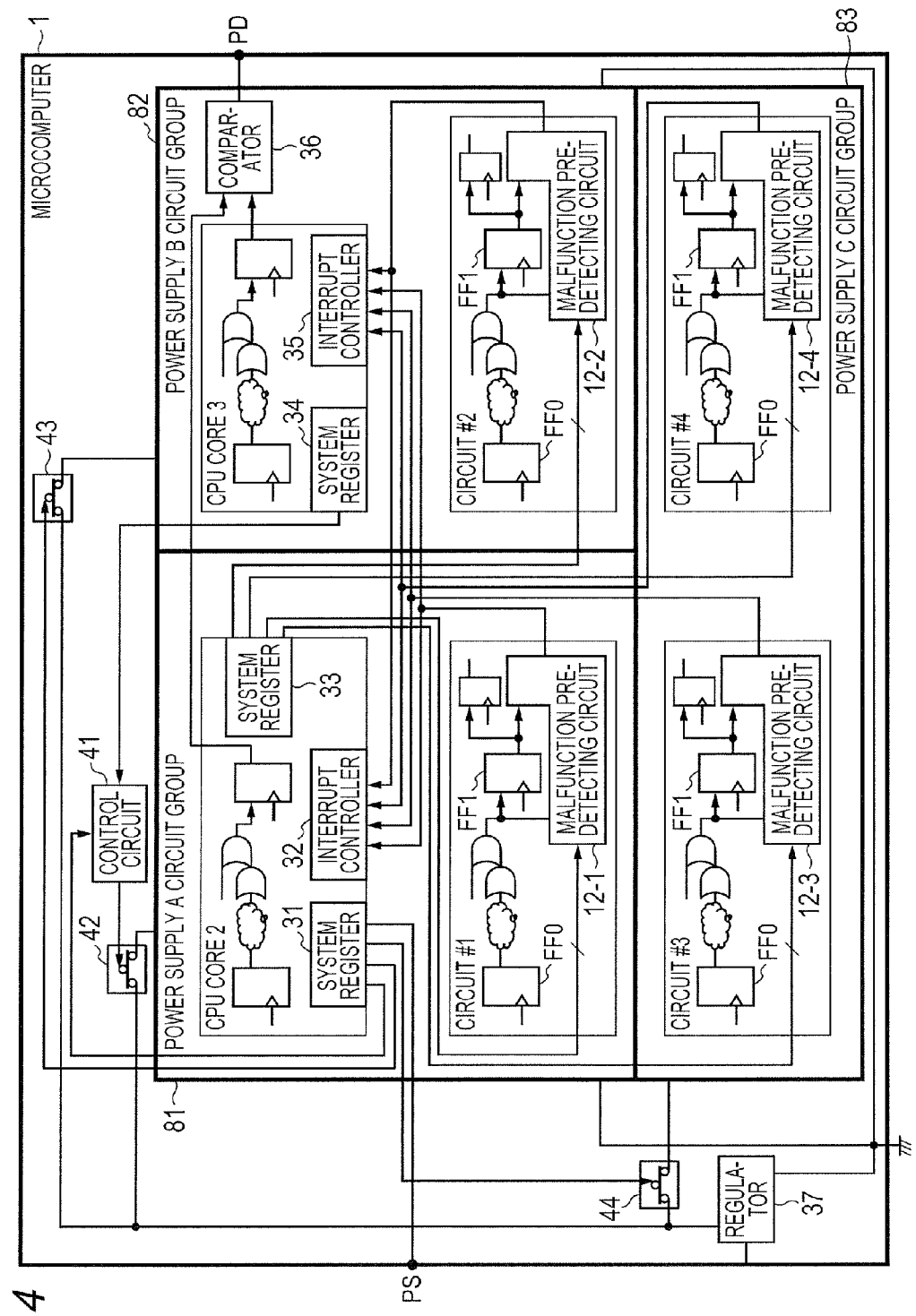
FIG. 4 is a diagram depicting a configuration of the microcomputer of the first embodiment.

FIG. 4 is a diagram depicting a configuration of the microcomputer 1 of the first embodiment.

Referring to FIG. 4, the microcomputer 1 is a microcomputer of dual core lockstep architecture and has a power supply A circuit group 81, a power supply B circuit group 82, a power supply C circuit group 83, a regulator 37, a control circuit 41, a power supply A switch 42, a power supply B switch 43, and a power supply C switch 44.

The power supply A circuit group 81 has a main CPU core 2 and a circuit #1.

The main CPU core 2 includes an interrupt controller 32, a system register 31, and a system register 33.

The circuit #1 includes a malfunction pre-detecting circuit 12-1 provided on a route branching off from a route between two flip-flops FF0, FF1 which make up a functional circuit within the circuit #1.

The power supply B circuit group 82 has a CPU core 3 for checking, a comparator 36, and a circuit #2.

The circuit #2 includes a malfunction pre-detecting circuit 12-2 provided on a route branching off from a route between two flip-flops FF0, FF1 which make up a functional circuit within the circuit #2.

The CPU core 3 for checking includes an interrupt controller 35 and a system register 34.

The power supply C circuit group 83 has a circuit #3 and a circuit #4.

The circuit #3 includes a malfunction pre-detecting circuit 12-3 provided on a route branching off from a route between two flip-flops FF0, FF1 which make up a functional circuit within the circuit #3. The circuit #4 includes a malfunction pre-detecting circuit 12-4 provided on a route branching off from a route between two flip-flops FF0, FF1 which make up a functional circuit within the circuit #4.

The regulator 37 generates a power supply voltage for the power supply A circuit group 81 from an externally supplied power supply voltage and supplies the generated power supply voltage to the power supply A circuit group 81 via the power supply A switch 42. The regulator 37 generates a power supply voltage for the power supply B circuit group 82 from the externally supplied power supply voltage and supplies the generated power supply voltage to the power supply B circuit group 82 via the power supply B switch 43. The regulator 37 generates a power supply voltage for the power supply C circuit group 83 from the externally supplied power supply voltage and supplies the generated power supply voltage to the power supply C circuit group 83 via the power supply C switch 44.

The main CPU core 2 and the CPU core 3 for checking execute identical processing operations. A signal representing a processing result by the main CPU core 2 and a signal representing a processing result by the CPU core 3 for checking are sent to the comparator 36. The comparator 36 compares the signals representing the processing results by the two CPU cores 2, 3 and sends a signal representing a comparison result to a system external to the microcomputer 1 via a terminal PD.

Comparison result signals DS output respectively by the malfunction pre-detecting circuit 12-1 in the circuit #1, the malfunction pre-detecting circuit 12-2 in the circuit #2, the malfunction pre-detecting circuit 12-3 in the circuit #3, and the malfunction pre-detecting circuit 12-4 in the circuit #4 are sent to the interrupt controller 32 within the main CPU core 2 and the interrupt controller 35 within the CPU core 3 for checking. The interrupt controller 32 and the interrupt controller 35 recognize having been notified of an interrupt signifying a malfunction risk when a comparison result signal DS has become "Low" level.

From the system register 33, a test mode signal tm, test data tv1, and test data tv2 are sent to any of the malfunction pre-detecting circuit 12-1 in the circuit #1, the malfunction pre-detecting circuit 12-2 in the circuit #2, the malfunction pre-detecting circuit 12-3 in the circuit #3, and the malfunction pre-detecting circuit 12-4 in the circuit #4.

The main CPU core 2 sends a switching signal from the system register 31 to each of the power supply C switch 44 and the power supply B switch 43. If the switching signal to the power supply C switch 44 is "Low" level, the power supply C switch 44 turns off; if the switching signal to the power supply C switch 44 is "High" level, the power supply C switch 44 turns on. If the switching signal to the power supply B switch 43 is "Low" level, the power supply B switch 43 turns off; if the switching signal to the power supply B switch 43 is "High" level, the power supply B switch 43 turns on.

Also, the main CPU core 2 sends a switching signal from the system register 31 to the control circuit 41. The CPU core 3 for checking also sends a switching signal from the system register 34 to the control circuit 41. If the switching signal to the control circuit 41 is "Low" level, the control circuit 41 turns the power supply A switch 42 off; if the switching signal to the control circuit 41 is "High" level, the control circuit 41 turns the power supply A switch 42 on.

The main CPU core 2 sets the switching signal to the control circuit 41 to "Low" level, when the interrupt controller 32 has received an interrupt signifying a malfunction risk from the malfunction pre-detecting circuit 12-1. The main CPU core 2 sets the switching signal to the power supply B switch 43 to "Low" level, when the interrupt controller 32 has received an interrupt signifying a malfunction risk from the malfunction pre-detecting circuit 12-2. The main CPU core 2 sets the switching signal to the power supply C switch 44 to "Low" level, when the interrupt controller 32 has received an interrupt signifying a malfunction risk from the malfunction pre-detecting circuit 12-3. The main CPU core 2 sets the switching signal to the power supply C switch 44 to "Low" level, when the interrupt controller 32 has received an interrupt signifying a malfunction risk from the malfunction pre-detecting circuit 12-4.

Besides, when the interrupt controller 32 has received an interrupt signifying a malfunction risk, the main CPU core 2 outputs a signal signifying the occurrence of a malfunction risk from the system register 31 to the system external to the microcomputer 1 via a terminal PS.

Figure 5:
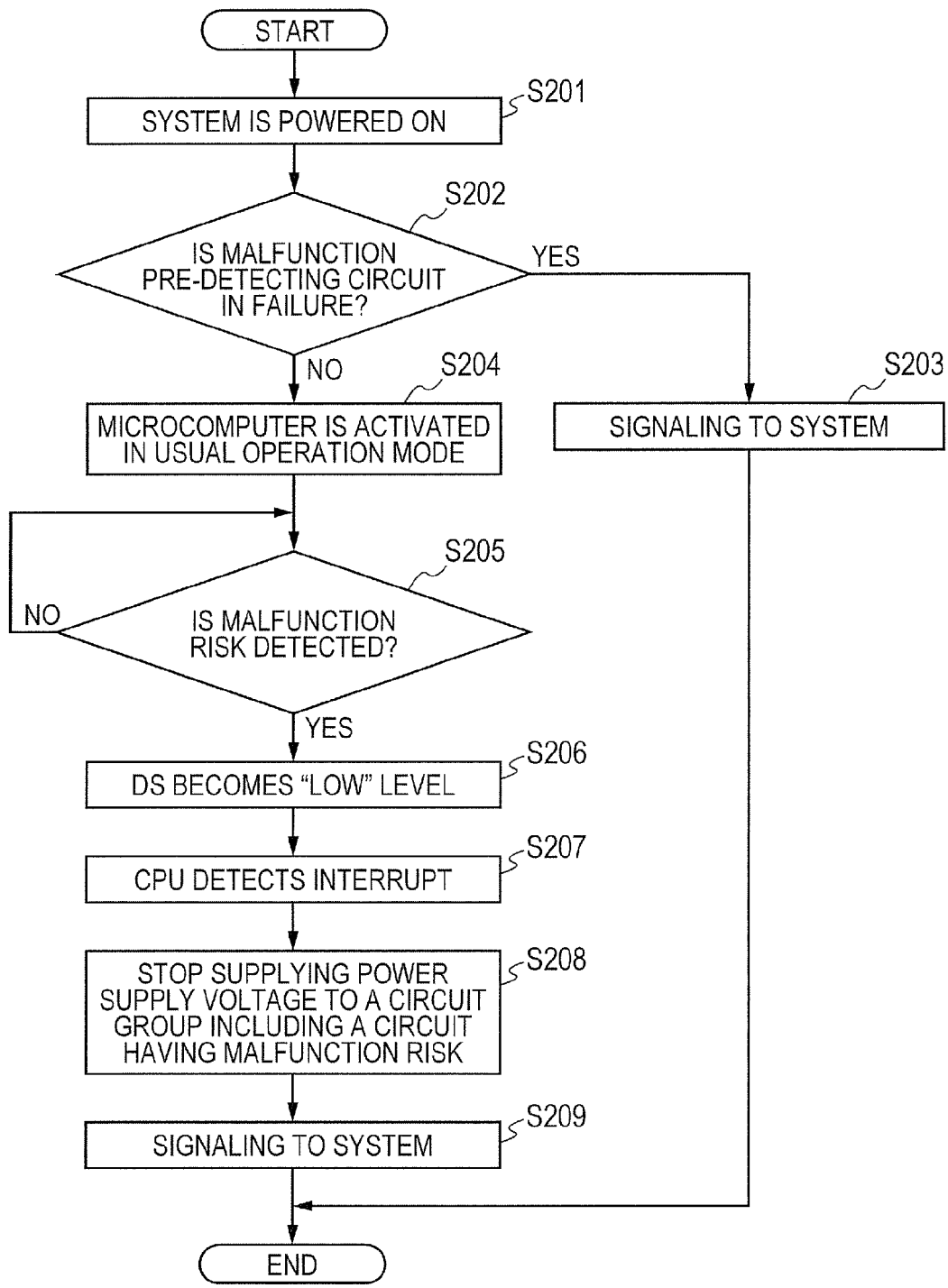
FIG. 5 is a flowchart representing a malfunction pre-detection procedure which is performed by the microcomputer 1.

FIG. 5 is a flowchart representing a malfunction pre-detection procedure which is performed by the microcomputer 1.

A system in which the microcomputer 1 is installed is powered on. The power supply A switch 42, power supply B switch 43, and power supply C switch 44 turn on and a power supply voltage is supplied from the regulator 37 to all circuits in the power supply A circuit group 81, power supply B circuit group 82, and power supply C circuit group 83 (step S201).

As for one or more malfunction pre-detecting circuits 12 provided within the microcomputer 1, the main CPU core 2 determines whether or not a malfunction pre-detecting circuit itself is in failure. Determining whether a malfunction pre-detecting circuit 12 itself is in failure is not only made upon the power-on of the system and may be made to verify that the malfunction pre-detecting circuits 12 are not in failure upon having detected a malfunction risk or in other occasions. A way of making this determination will be described later.

If a malfunction pre-detecting circuit is in failure, as determined (YES at step S202), the main CPU core 2 sends a signal indicating that a failure has occurred to the system via a terminal PS (step S203).

If no malfunction pre-detecting circuit is in failure, as determined (NO at step S202), the main CPU core 2 activates the entire microcomputer 1 in usual operation mode (step S204).

If the malfunction pre-detecting circuits 12 do not detect a malfunction risk (that is, an increase of delay of signal transmission from a preceding flip-flop and a following flip-flop), the comparison result signal DS that is output from the malfunction pre-detecting circuits 12 is "High" level as presented I FIG. 2.

If a malfunction pre-detecting circuits 12 detects a malfunction risk (Yes at step S205), the comparison result signal DS that is output from the malfunction pre-detecting circuit 12 becomes "Low" level for only a period that is at least an integral multiple of a CLK cycle T (step S206).

When the comparison result signal DS has become "Low" level, the interrupt controller 32 of the main CPU core 2 and the interrupt controller 35 of the CPU core 3 for checking recognize having been notified of an interrupt signifying a malfunction risk (step S207).

Upon detecting the interrupt, the main CPU core 2 stops supplying the power supply voltage to a circuit group including the malfunction pre-detecting circuit 12 and a functional circuit (the flip-flop FF1 and flip-flop FF2) for which a malfunction risk was detected. More specifically, if the malfunction pre-detecting circuit 12 and a functional circuit for which a malfunction risk was detected belong to a power supply A circuit group 81, the main CPU core 2 instructs the control circuit 41 to turn the power supply A switch 42 off. If the malfunction pre-detecting circuit 12 and a functional circuit for which a malfunction risk was detected belong to a power supply B circuit group 82, the main CPU core 2 turns the power supply B switch 43 off. If the malfunction pre-detecting circuit 12 and a functional circuit for which a malfunction risk was detected belong to a power supply C circuit group 83, the main CPU core 2 turns the power supply C switch 44 off (step S208).

Then, the main CPU core 2 outputs a signal signifying the occurrence of a malfunction risk from the system register 31 via the terminal PS to the system external to the microcomputer 1 (S209).

Figure 6:
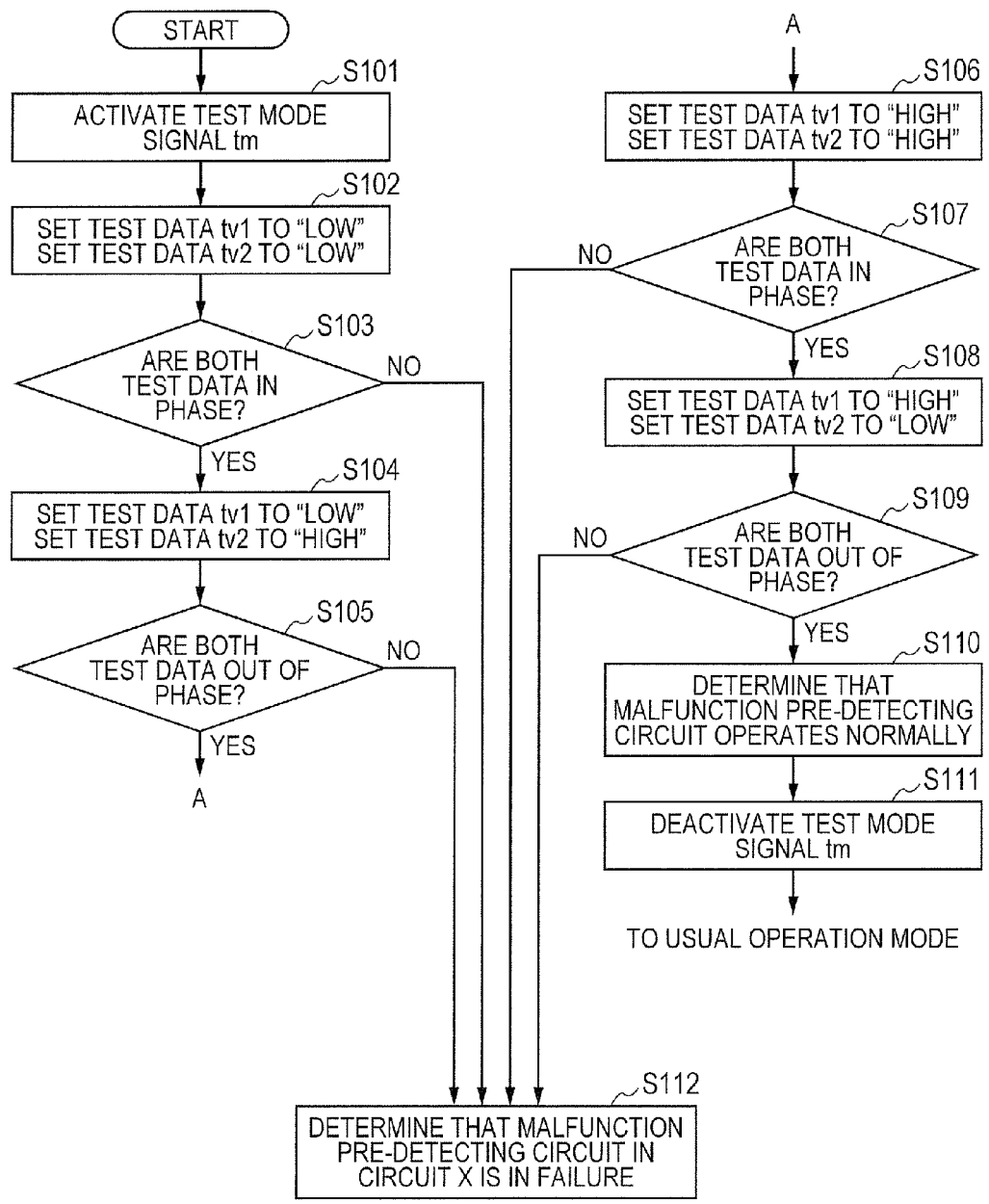
FIG. 6 is a flowchart representing a procedure for detecting the failure of a malfunction pre-detecting circuit itself in step S202 in FIG. 5.

FIG. 6 is a flowchart representing a procedure for detecting the failure of a malfunction pre-detecting circuit 12 itself in the step S202 in FIG. 5.

Referring to FIG. 6, the main CPU core 2 activates the test mode signal tm to a circuit X (any of the circuits #1 to #4 in FIG. 4) (step S101).

Then, the main CPU core 2 sets test data tv1 for the circuit X to "Low" level and sets test data tv2 for the circuit X to "Low" level (step S102).

When having detected that both test data are out of phase (that is, when the comparison result signal DS has become "Low" level) (NO at step S103), the main CPU core 2 determines that the malfunction pre-detecting circuit 12 in the circuit X is in failure (step S112).

When having not detected that both test data are out of phase (that is, the comparison result signal DS remained at "High" level) (YES at step S103), the main CPU core 2 sets the test data tv1 to "Low" level and sets the test data tv2 to "High" level (step S104).

When having not detected that both test data are out of phase (that is, the comparison result signal DS remained at "High" level) (NO at step S105), the main CPU core 2 determines that the malfunction pre-detecting circuit 12 in the circuit X is in failure (step S112).

When having detected that both test data are out of phase (that is, when the comparison result signal DS has become "Low" level) (YES at step S105), the main CPU core 2 sets the test data tv1 to "High" level and sets the test data tv2 to "High" level (step S106).

When having detected that both test data are out of phase (that is, when the comparison result signal DS has become "Low" level) (NO at step S107), the main CPU core 2 determines that the malfunction pre-detecting circuit 12 in the circuit X is in failure (step S112).

When having not detected that both test data are out of phase (that is, the comparison result signal DS remained at "High" level) (YES at step S107), the main CPU core 2 sets the test data tv1 to "High" level and sets the test data tv2 to "Low" level" (step S108).

When having not detected that both test data are out of phase (that is, the comparison result signal DS remained at "High" level) (NO at step S109), the main CPU core 2 determines that the malfunction pre-detecting circuit 12 in the circuit X is in failure (step S112).

When having detected that both test data are out of phase (that is, when the comparison result signal DS has become "Low" level) (YES at step S109), main CPU core 2 determines that the malfunction pre-detecting circuit 12 in the circuit X operates normally (step S110).

Then, the main CPU core 2 deactivates the test mode signal tm to the circuit X (step S111)

Figure 7:
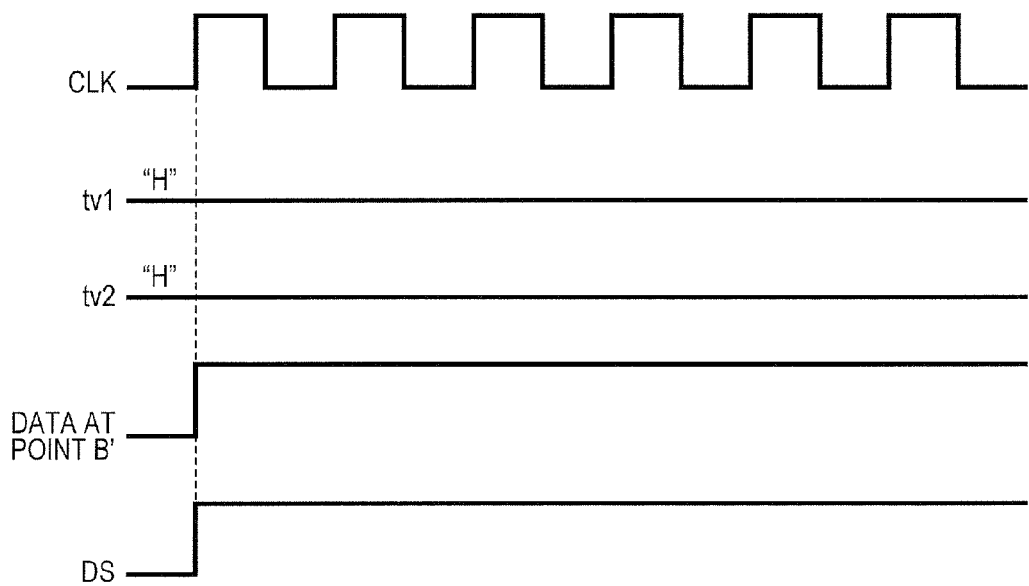
FIG. 7 is a diagram for explaining a way of determining whether or not a malfunction pre-detecting circuit is in failure in test operation mode.

FIG. 7 is a diagram for explaining a way of determining whether or not a malfunction pre-detecting circuit 12 is in failure in test operation mode.

Referring to FIG. 7, the main CPU core 2 sets the test data tv1 to "High" level and sets the test data tv2 to "High" level.

The test data tv2 is input to the data input terminal of the flip-flop FFT. The flip-flop FFT changes its output (data at point B') to "High" level in sync with a rising edge #0 of the clock CLK.

The comparator CMP compares the test data tv1 and the data at point B' The test data tv1 and the data at point B' are in phase at and after the rising edge #0 of the clock CLK and the comparison result signal DS is "High" level.

Figure 8:
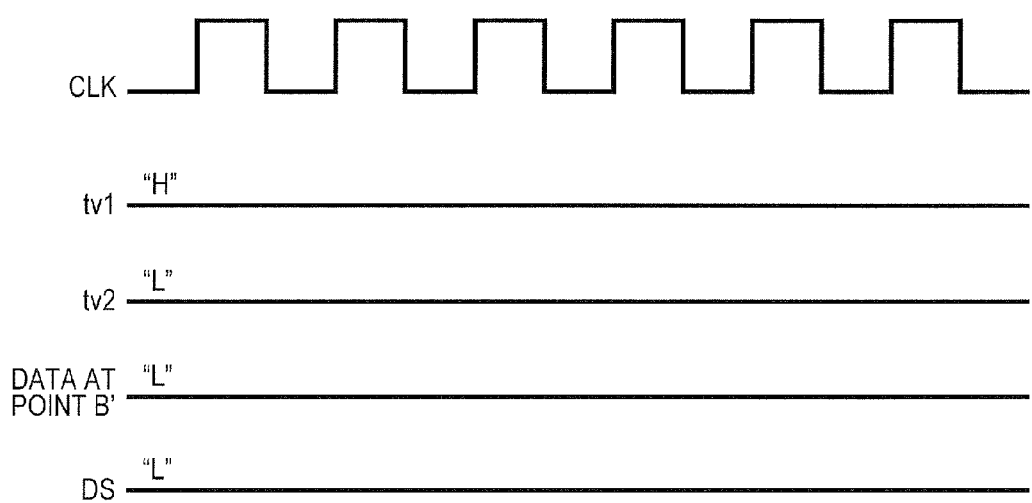
FIG. 8 is a diagram for explaining the way of determining whether or not a malfunction pre-detecting circuit is in failure in test operation mode.

FIG. 8 is a diagram for explaining the way of determining whether or not a malfunction pre-detecting circuit 12 is in failure in test operation mode.

Referring to FIG. 8, the main CPU core sets the test data tv1 to "High" level and sets the test data tv2 to "Low" level.

The test data tv2 is input to the data input terminal of the flip-flop FFT. Because the test data tv2 remains at "Low" level, the output (data at point B') of the flip-flop FFT remains unchanged at "Low" level.

The comparator CMP compares the test data tv1 and the data at point B'. Because the test data tv1 and the data at point B' are out of phase, the comparison result signal DS is "Low" level.

Figure 9:
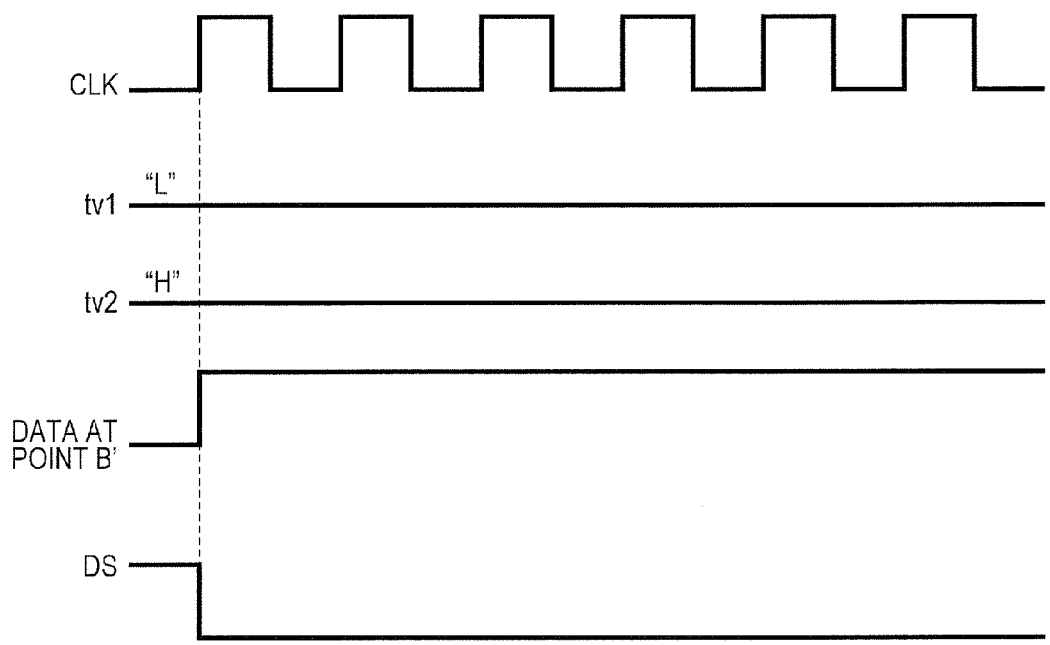
FIG. 9 is a diagram for explaining the way of determining whether or not a malfunction pre-detecting circuit is in failure in test operation mode.

FIG. 9 is a diagram for explaining the way of determining whether or not a malfunction pre-detecting circuit 12 is in failure in test operation mode.

Referring to FIG. 8, the main CPU core sets the test data tv1 to "Low" level and sets the test data tv2 to "High" level.

The test data tv2 is input to the data input terminal of the flip-flop FFT. The flip-flop FFT changes its output (data at point B') to "High" level in sync with a rising edge #0 of the clock CLK.

The comparator CMP compares the test data tv1 and the data at point B'. The test data tv1 and the data at point B' are out of phase at and after the rising edge #0 of the clock CLK and the comparison result signal DS is "Low" level.

Figure 10:
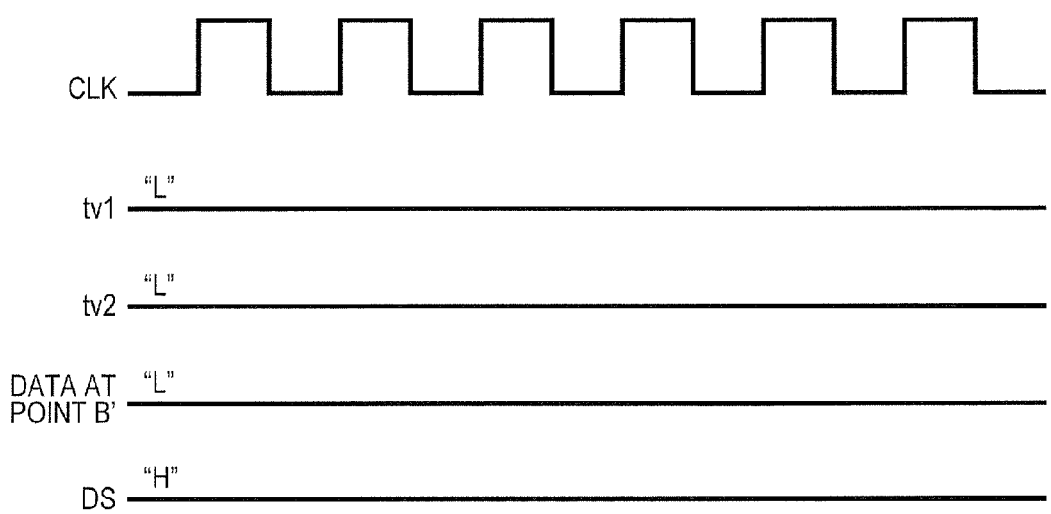
FIG. 10 is a diagram for explaining the way of determining whether or not a malfunction pre-detecting circuit is in failure in test operation mode.

FIG. 10 is a diagram for explaining the way of determining whether or not a malfunction pre-detecting circuit 12 is in failure in test operation mode.

Referring to FIG. 10, the main CPU core sets the test data tv1 to "Low" level and sets the test data tv2 to "Low" level.

The test data tv2 is input to the data input terminal of the flip-flop FFT. Because the test data tv2 is "Low" level, the output (data at point B') of the flip-flop FFT remains unchanged at "Low" level.

The comparator CMP compares the test data tv1 and the data at point B'. Because the test data tv1 and the data at point B' are in phase, the comparison result signal DS is "High" level.

As described above, according to the present embodiment, a low resistive short circuit can be detected early by the malfunction pre-detecting circuits provided in arbitrary locations within the semiconductor device. It is possible to take a remedial action for a fault in a functional circuit in the semiconductor device before its manifestation. According to the present invention, the failure of a malfunction pre-detecting circuit itself can also be detected and, thus, a signal delay due to over-temperature or the like can be detected accurately. Once temperature rise has been detected in a circuit group, supplying the power supply voltage to the circuit group is stopped. Thus, the influence of a failure can be confined to a power supply plane (circuit group) in which a short circuit between power supply and ground has occurred. Consequently, generated heat does not propagate to other circuit groups and other circuit groups do not suffer from temperature rise and their faulty operation is prevented.

As a method alternative to the present embodiment, in order to detect a faulty operation due to over-temperature, such a scheme can be conceived that the delay of one or more paths having a small operating margin in the CPU core 3 for checking is made to worsen by design and the CPU core operation with a practically no operating margin is implemented. By making one CPU core suffer from worsened delay by design and operate with a practically no operating margin in this way, when the operating temperature has become slightly out of an operation guaranteed temperature range and the delay of such path(s) has deteriorated slightly, a faulty operation of the CPU core 3 for checking occurs beyond a critical delay defined to be regarded as an operation error. Because of inconsistency with the operation of the main CPU core 2, a malfunction of the main CPU core 2 can be pre-detected.

However, this method has the following demerits.

(1) It is possible to pre-detect a malfunction by curtailing the operating margin of one CPU core itself in dual core lockstep architecture. However, this method is a scheme that makes a malfunction more likely to occur and a technique that confuses the order of things in terms of functional safety.

(2) Because the dual core lockstep architecture is used as is, it is not always true that a flip-flop whose delay is deteriorated is coupled to a comparator. Therefore, it is not always true that, even if a faulty operation occurs because of delay deterioration, an error is detected upon its occurrence.

(3) The dual core lockstep architecture is used as is. If a faulty operation has been detected, it is unable to discriminate between a faulty operation because of a software error caused by α ray and a faulty operation because of generated heat and there is a problem that it is unable to take a remedial action properly.

(4) The purpose of this method is detecting a malfunction of the CPU core 2 itself. In case an error has been detected, the reliability of the CPU core 2 itself is suspected. Because a decision cannot be made within the semiconductor device, action to be done is only signaling to a system external to the semiconductor device.

(5) Because a path provided in a portion of the CPU core 3 for checking is used, detecting an internal temperature rise in the CPU core 3 for checking is confined within that portion. If a low resistive short circuit occurs and heat is generated at a particular point within the semiconductor device, it is impossible to detect such a malfunction until the generated heat has propagated to that portion within which the detection of temperature rise is confined. The method is not applicable for a case in which a faulty operation of any other circuit occurs for an interval until the heat has propagated.

(6) This scheme cannot be adopted in the main CPU core 2 from a perspective of gaining the operating margin of the main CPU core 2. Therefore, if temperature greatly rises in the main CPU core 2 even if the CPU core 3 for checking operates normally, deterioration in the speed of the main CPU core 2 manifests early. For some situations like this, a faulty operation cannot be detected on ahead by this method.

(7) The main CPU core 2 and the CPU core 3 for checking differ physically and each core needs to be laid out separately.

(8) In a case where there are a plurality of power supply lines within the semiconductor device, it is unable to identify where a malfunction (a low resistive short circuit) occurs and it is impossible to take a remedial action separately for each power supply line.

In contrast, the present embodiment has a feature that it is free from the foregoing problems.

Second Embodiment

Figure 11:
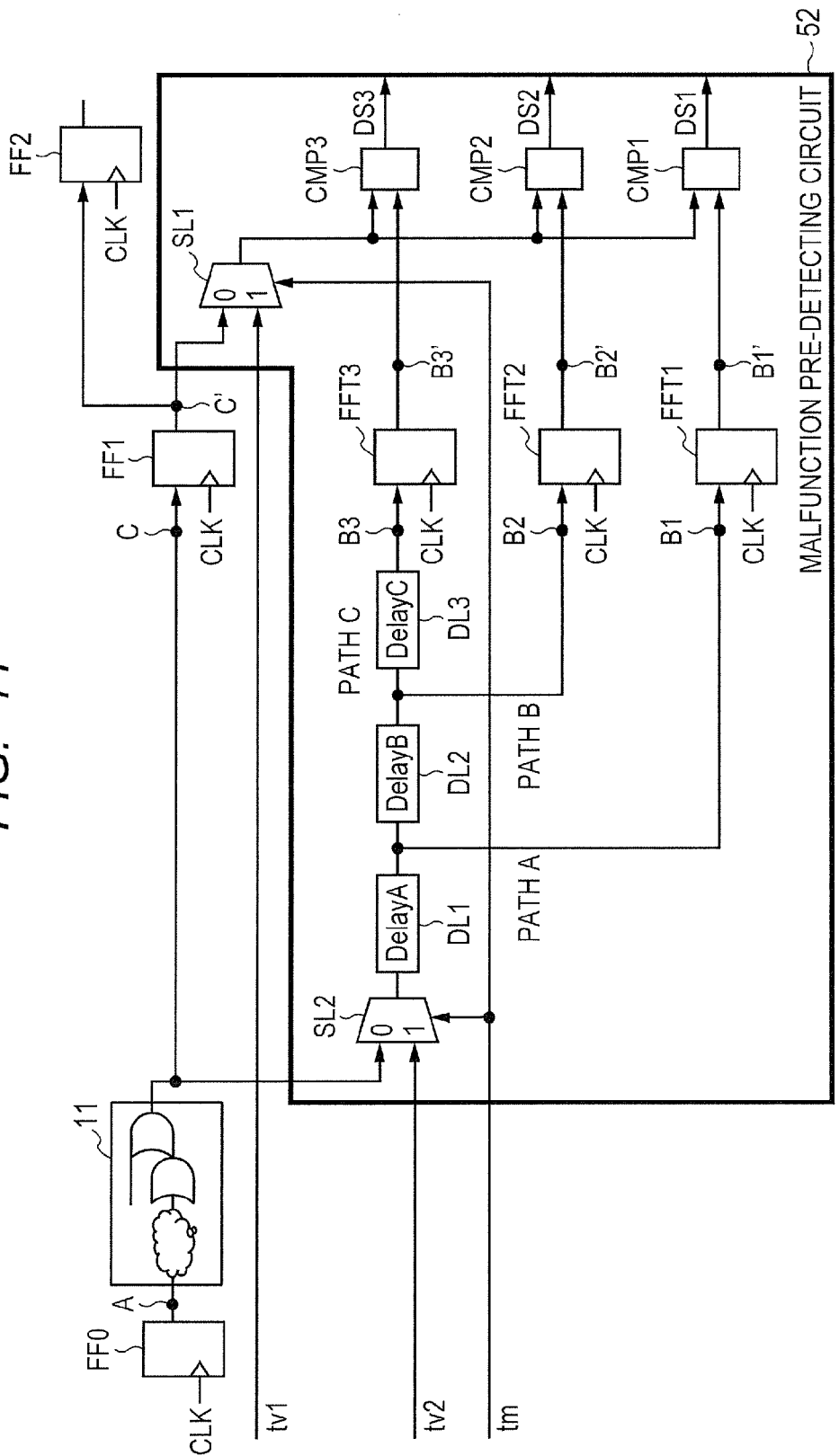
FIG. 11 is a diagram depicting a configuration of a part of a microcomputer of a second embodiment.

FIG. 11 is a diagram depicting a configuration of a part of a microcomputer of a second embodiment.

Referring to FIG. 11, the microcomputer has a flip-flop FF0, a logic circuit 11, a flip-flop FF1, and a flip-flop FF2 which serve as a functional circuit.

The microcomputer 1 has a malfunction pre-detecting circuit 52 provided on a route branching off from a route between the flip-flop FF0 and the flip-flop FF1. The malfunction pre-detecting circuit 52 has a selector SL2, delay circuits DL1, DL2, DL3, flip-flops FFT1, FFT2, FFT3, a selector SL1, and comparators CMP1, CMP2, CMP3.

The flip-flop FF0 has a data input terminal to which real data is input in usual operation mode, an input terminal to which a clock CLK is input, and an output terminal.

The logic circuit 11 receives data that is output from the output terminal of the flip-flop FF0 and performs logical operation of the data among others.

Output of the logic circuit 11 branches into two routes, one of which is coupled to the flip-flop FF1 and the other of which is coupled to the selector SL2 in the malfunction pre-detecting circuit 52.

The flip-flop FF1 has a data input terminal that receives output of the logic circuit 11 in usual operation mode, a clock terminal to which the clock CLK is input, and an output terminal.

Output of the flip-flop FF1 branches into two routes, one of which is coupled to the flip-flop FF2 and the other of which is coupled to the selector SL1 in the malfunction pre-detecting circuit 52.

The flip-flop FF2 has a data input terminal that receives output of the flip-flop FF1 in usual operation mode, a clock terminal to which the clock CLK is input, and an output terminal.

The selector SL2 receives data output from the logic circuit 11 and test data tv2. The selector SL2 outputs the test data tv2 to the delay circuit DL, when a test mode signal tm is activated. The selector SL2 outputs the data output from the logic circuit 11 to the delay circuit DL, when the test mode signal tm is deactivated.

The delay circuit DL1 delays an output signal of the selector SL2. The delay circuit DL2 delays output of the delay circuit DL1. The delay circuit DL3 delays output of the delay circuit DL2.

The flip-flop FFT1 has a data input terminal that receives output of the delay circuit DL, a clock terminal to which the clock CLK is input, and an output terminal.

The flip-flop FFT2 has a data input terminal that receives output of the delay circuit DL2, a clock terminal to which the clock CLK is input, and an output terminal.

The flip-flop FFT3 has a data input terminal that receives output of the delay circuit DL3, a clock terminal to which the clock CLK is input, and an output terminal.

The selector SL1 receives data output from the flip-flop FF1 and test data tv1. The selector SL1 outputs the test data tv1 to the comparators CMP1, CMP2, CMP3, when the test mode signal tm is activated. The selector SL1 outputs the data output from the flip-flop FF1 to the comparators CMP1, CMP2, CMP3, when the test mode signal tm is deactivated.

The comparator CMP1 sets a comparison result signal DS1 to "High" level, when an output signal of the selector SL1 and an output signal of the flip-flop FFT1 are in phase, and sets the comparison result signal DS1 to "Low" level, when both output signals are out of phase.

More specifically, in test operation mode, the comparator CMP1 sets the comparison result signal DS1 to "High" level, when test data tv1 and test data tv2 passed through the delay circuit DL1 and the flip-flop FFT1 are in phase, and sets the comparison result signal DS1 to "Low" level, when both test data are out of phase.

In usual operation mode, the comparator CMP1 sets the comparison result signal DS1 to "High" level, when real data passed through the flip-flop FF1 and real data passed through the delay circuit DL1 and the flip-flop FFT1 are in phase, and sets the comparison result signal DS1 to "Low" level, when both real data are out of phase.

The comparator CMP2 sets a comparison result signal DS2 to "High" level, when an output signal of the selector SL1 and an output signal of the flip-flop FFT2 are in phase, and sets the comparison result signal DS2 to "Low" level, when both output signals are out of phase.

More specifically, in test operation mode, the comparator CMP2 sets the comparison result signal DS2 to "High" level, when test data tv1 and test data tv2 passed through the delay circuits DL1, DL2 and the flip-flop FFT2 are in phase, and sets the comparison result signal DS2 to "Low" level, when both test data are out of phase.

In usual operation mode, the comparator CMP2 sets the comparison result signal DS2 to "High" level, when real data passed through the flip-flop FF1 and real data passed through the delay circuits DL1, DL2 and the flip-flop FFT2 are in phase, and sets the comparison result signal DS2 to "Low" level, when both real data are out of phase.

The comparator CMP3 sets a comparison result signal DS3 to "High" level, when an output signal of the selector SL1 and an output signal of the flip-flop FFT3 are in phase, and sets the comparison result signal DS3 to "Low" level, when both output signals are out of phase.

More specifically, in test operation mode, the comparator CMP3 sets the comparison result signal DS3 to "High" level, when test data tv1 and test data tv2 passed through the delay circuits DL1, DL2, DL3 and the flip-flop FFT3 are in phase, and sets the comparison result signal DS3 to "Low" level, when both test data are out of phase.

In usual operation mode, the comparator CMP3 sets the comparison result signal DS3 to "High" level, when real data passed through the flip-flop FF1 and real data passed through the delay circuits DL1, DL2, DL3 and the flip-flop FFT3 are in phase, and sets the comparison result signal DS3 to "Low" level, when both real data are out of phase.

Figure 12:
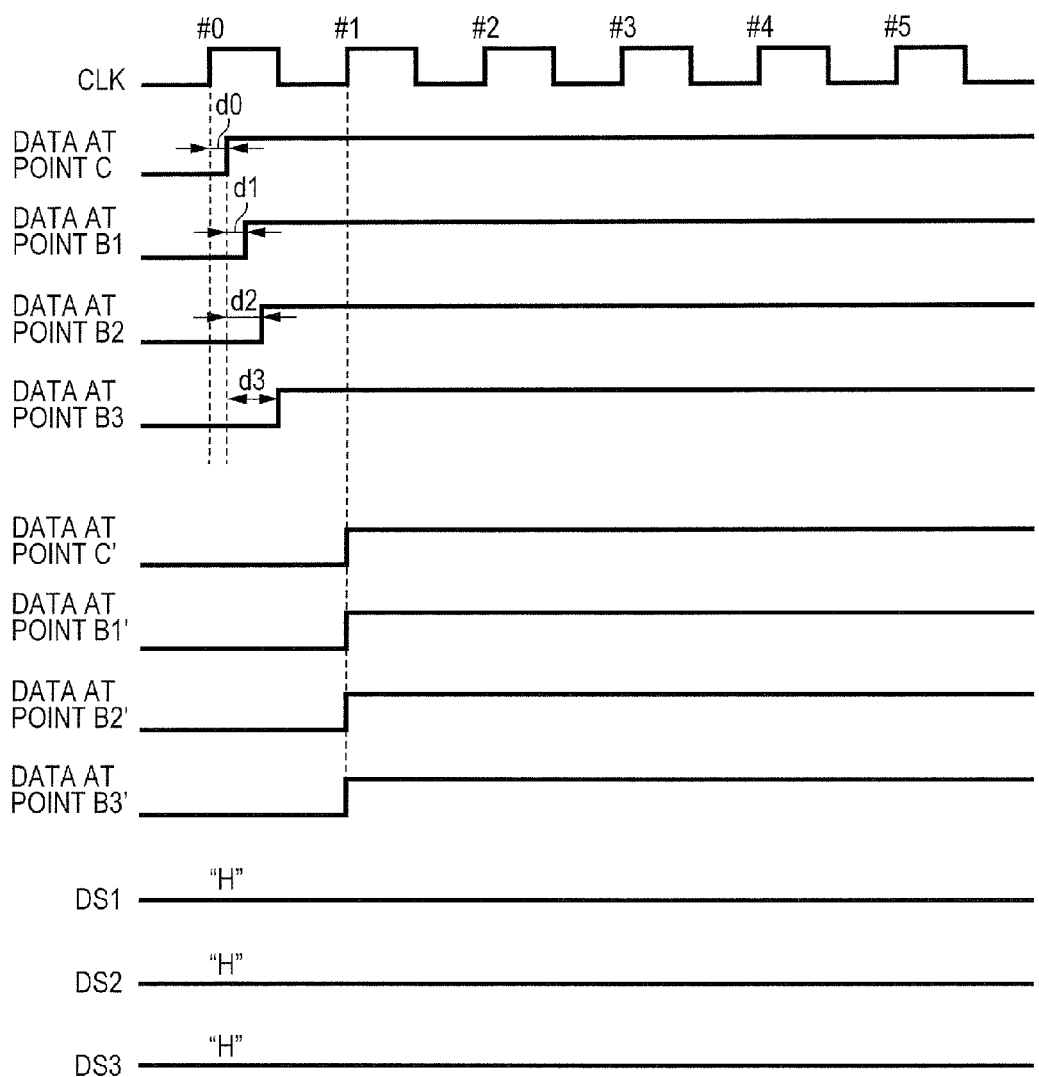
FIG. 12 is a diagram for explaining normal operation in usual operation mode.

FIG. 12 is a diagram for explaining normal operation (within an operation guaranteed temperature range) in usual operation mode.

Referring to FIG. 12, data at point C is input to the data input terminal of the flip-flop FF1. The data at point C lags by a time d0 relative to a rising edge #0 of the clock CLK. The flip-flop FF1 changes its output (data at point C') to "High" level in sync with a rising edge #1 of the clock CLK.

Data at point B1 is input to the data input terminal of the flip-flop FFT1. The data at point B1 lags by a time d1 behind the data at point C, delayed by the delay circuit DLL. The flip-flop FFT1 changes its output (data at point B1') to "High" level in synch with the rising edge #1 of the clock CLK.

The comparator CMP1 compares the data at point C' and the data at point B1' Because the data at point C' and the data at point B1' are in phase constantly, the comparison result signal DS1 remains at "High" level constantly.

Data at point B2 is input to the data input terminal of the flip-flop FFT2. The data at point 32 lags by a time d2 behind the data at point C, delayed by the delay circuits DL1 and DL2. The flip-flop FFT2 changes its output (data at point B2') to "High" level in synch with the rising edge #1 of the clock CLK.

The comparator CMP2 compares the data at point C' and the data at point B2'. Because the data at point C' and the data at point B2' are in phase constantly, the comparison result signal DS2 remains at "High" level constantly.

Data at point B3 is input to the data input terminal of the flip-flop FFT3. The data at point B3 lags by a time d3 behind the data at point C, delayed by the delay circuits DL1, DL2, and DL3. The flip-flop FFT3 changes its output (data at point B3') to "High" level in synch with the rising edge #1 of the clock CLK.

The comparator CMP3 compares the data at point C' and the data at point B3'. Because the data at point C' and the data at point B3' are in phase constantly, the comparison result signal DS3 remains at "High" level constantly.

Figure 13:
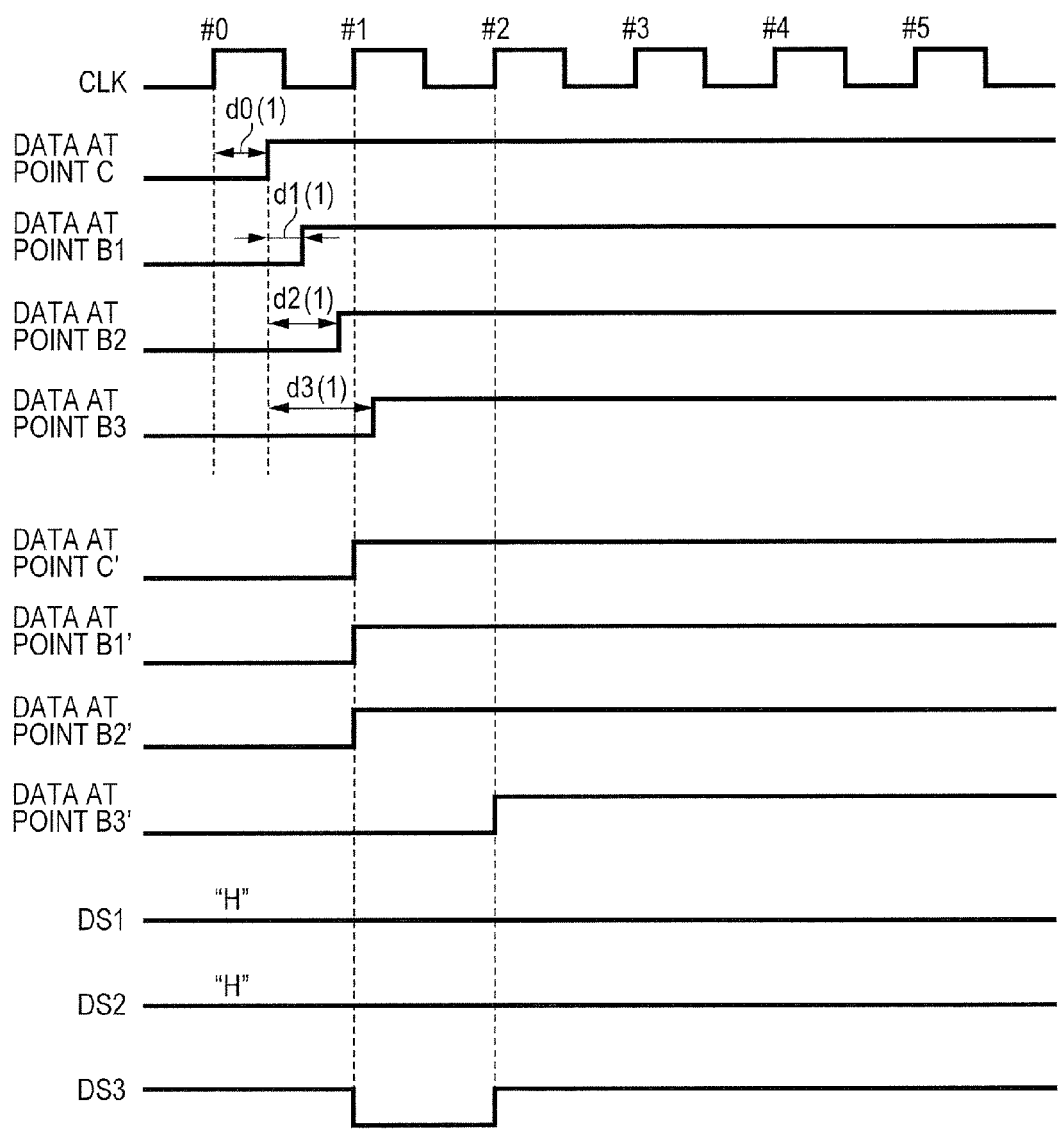
FIG. 13 is a diagram for explaining an example of operation, when a malfunction is pre-detected, in usual operation mode.

FIG. 13 is a diagram for explaining an example of operation, when a malfunction is pre-detected (in a case that temperature increased to Level 1) in usual operation mode.

Referring to FIG. 13, data at point C is input to the data input terminal of the flip-flop FF1. The data at point C lags by a time d0 (1) relative to a rising edge #0 of the clock CLK. The flip-flop FF1 changes its output (data at point C') to "High" level in sync with a rising edge #1 of the clock CLK.

Data at point B1 is input to the data input terminal of the flip-flop FFT1. The data at point B1 lags by a time d1 (1) behind the data at point C, delayed by the delay circuit DL1. The flip-flop FFT1 changes its output (data at point B1') to "High" level in synch with the rising edge #1 of the clock CLK.

The comparator CMP1 compares the data at point C' and the data at point B1' Because the data at point C' and the data at point B1' are in phase constantly, the comparison result signal DS1 remains at "High" level constantly.

Data at point B2 is input to the data input terminal of the flip-flop FFT2. The data at point B2 lags by a time d2 (1) behind the data at point C, delayed by the delay circuits DL1 and DL2. The flip-flop FFT2 changes its output (data at point B2') to "High" level in sync with the rising edge #1 of the clock CLK.

The comparator CMP2 compares the data at point C' and the data at point B2' Because the data at point C' and the data at point B2' are in phase constantly, the comparison result signal DS2 remains at "High" level constantly.

Data at point B3 is input to the data input terminal of the flip-flop FFT3. The data at point B3 lags by a time d3 (1) behind the data at point C, delayed by the delay circuits DL1, DL2, and DL3. The flip-flop FFT3 changes its output (data at point B3') to "High" level in synch with a rising edge #2 of the clock CLK.

The comparator CMP3 compares the data at point C' and the data at point B3'. Because the data at point C' and the data at point B3' are out of phase for a period from the rising edge #1 to the rising edge #2 of the clock CLK, the comparison result signal DS3 becomes "Low" level during this period.

Figure 14:
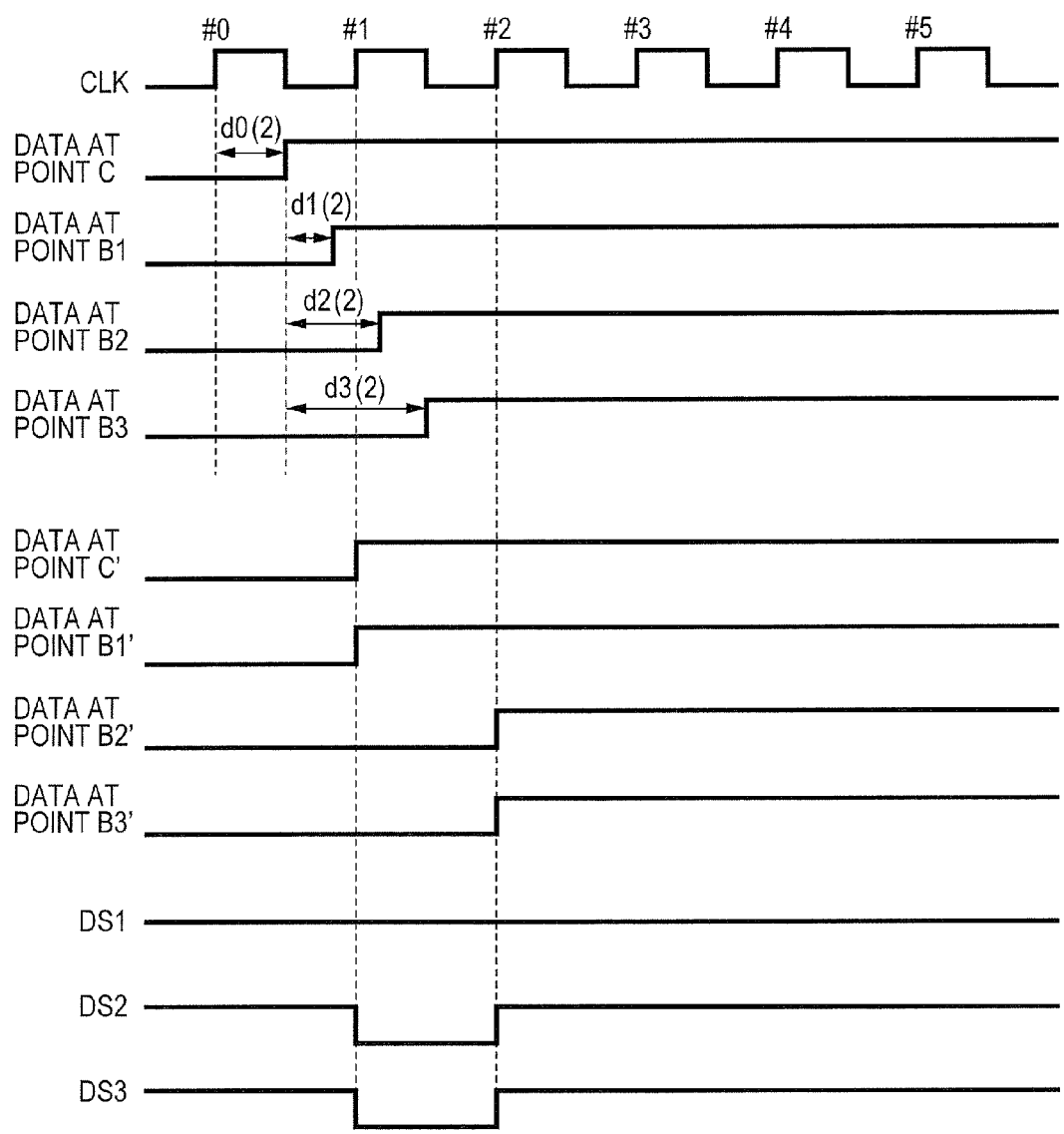
FIG. 14 is a diagram for explaining another example of operation, when a malfunction is pre-detected in usual operation mode.

FIG. 14 is a diagram for explaining another example of operation, when a malfunction is pre-detected (in a case that temperature increased to Level 2) in usual operation mode.

Referring to FIG. 14, data at point C is input to the data input terminal of the flip-flop FF1. The data at point C lags by a time d0 (2) relative to a rising edge #0 of the clock CLK. The flip-flop FF1 changes its output (data at point C') to "High" level in sync with a rising edge #1 of the clock CLK.

Data at point B1 is input to the data input terminal of the flip-flop FFT1. The data at point B1 lags by a time d1 (2) behind the data at point C, delayed by the delay circuit DLL. The flip-flop FFT1 changes its output (data at point B1') to "High" level in synch with the rising edge #1 of the clock CLK.

The comparator CMP1 compares the data at point C' and the data at point B1'. Because the data at point C' and the data at point B1' are in phase constantly, the comparison result signal DS1 remains at "High" level constantly.

Data at point B2 is input to the data input terminal of the flip-flop FFT2. The data at point B2 lags by a time d2 (2) behind the data at point C, delayed by the delay circuits DL1 and DL2. The flip-flop FFT2 changes its output (data at point B2') to "High" level in synch with a rising edge #2 of the clock CLK.

The comparator CMP2 compares the data at point C' and the data at point B2'. Because the data at point C' and the data at point B2' are out of phase for a period from the rising edge #1 to the rising edge #2 of the clock CLK, the comparison result signal DS2 becomes "Low" level during this period.

Data at point B3 is input to the data input terminal of the flip-flop FFT3. The data at point B3 lags by a time d3 (2) behind the data at point C, delayed by the delay circuits DL1, DL2, and DL3. The flip-flop FFT3 changes its output (data at point B3') to "High" level in synch with the rising edge #2 of the clock CLK.

The comparator CMP3 compares the data at point C' and the data at point B3' Because the data at point C' and the data at point B3' are out of phase for a period from the rising edge #1 to the rising edge #2 of the clock CLK, the comparison result signal DS3 becomes "Low" level during this period.

Figure 15:
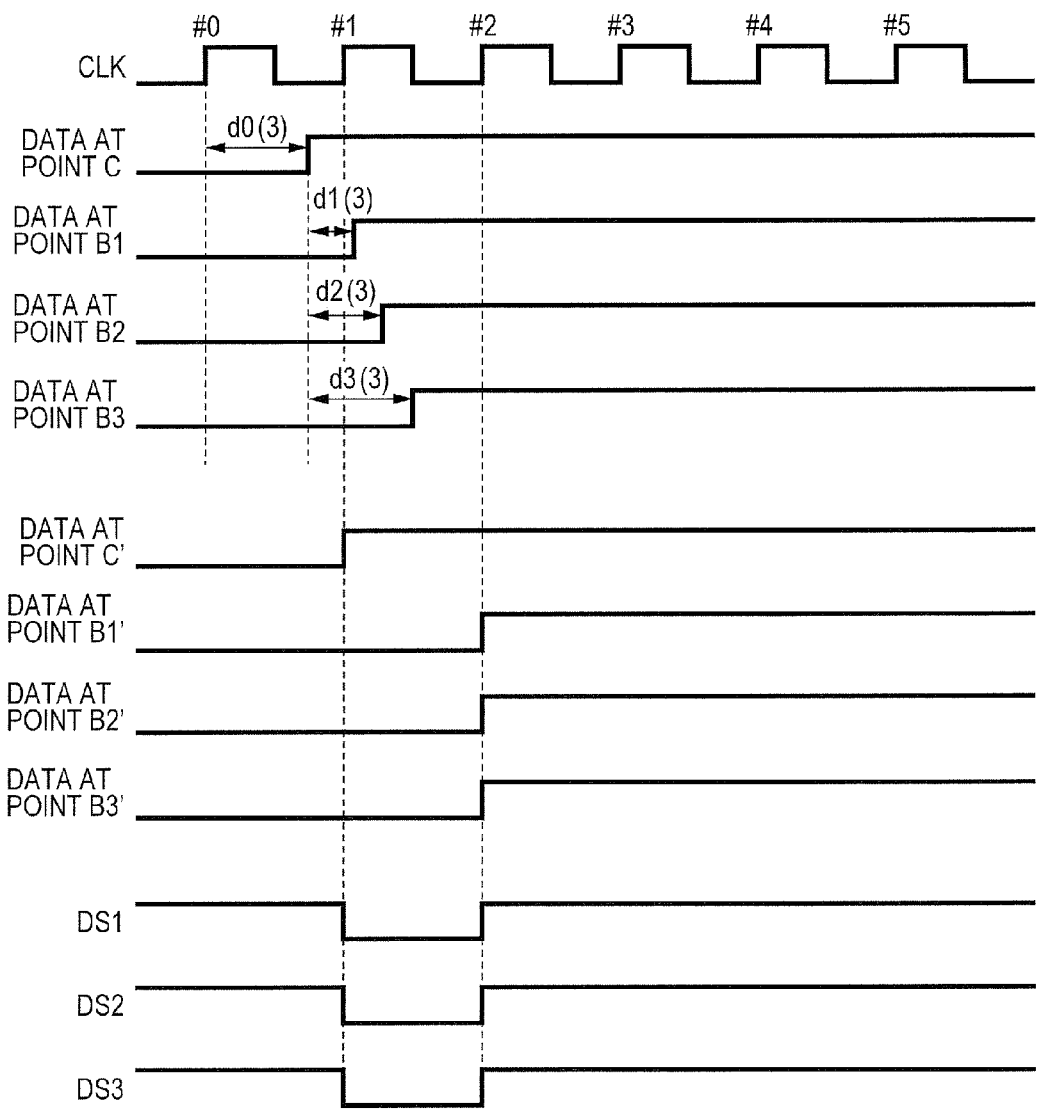
FIG. 15 is a diagram for explaining yet another example of operation, when a malfunction is pre-detected in usual operation mode.

FIG. 15 is a diagram for explaining yet another example of operation, when a malfunction is pre-detected (in a case that temperature increased to Level 3) in usual operation mode.

Referring to FIG. 15, data at point C is input to the data input terminal of the flip-flop FF1. The data at point C lags by a time d0 (3) relative to a rising edge #0 of the clock CLK. The flip-flop FF1 changes its output (data at point C') to "High" level in sync with a rising edge #1 of the clock CLK.

Data at point B1 is input to the data input terminal of the flip-flop FFT1. The data at point B1 lags by a time d1 (3) behind the data at point C, delayed by the delay circuit DL1. The flip-flop FFT1 changes its output (data at point B1') to "High" level in synch with a rising edge #2 of the clock CLK.

The comparator CMP1 compares the data at point C' and the data at point B1'. Because the data at point C' and the data at point B1' are out of phase for a period from the rising edge #1 to the rising edge #2 of the clock CLK, the comparison result signal DS1 becomes "Low" level during this period.

Data at point B2 is input to the data input terminal of the flip-flop FFT2. The data at point B2 lags by a time d2 (3) behind the data at point C, delayed by the delay circuits DL1 and DL2. The flip-flop FFT2 changes its output (data at point B2') to "High" level in synch with the rising edge #2 of the clock CLK.

The comparator CMP2 compares the data at point C' and the data at point B2'. Because the data at point C' and the data at point B2' are out of phase for a period from the rising edge #1 to the rising edge #2 of the clock CLK, the comparison result signal DS2 becomes "Low" level during this period.

Data at point B3 is input to the data input terminal of the flip-flop FFT3. The data at point B3 lags by a time d3 (3) behind the data at point C, delayed by the delay circuits DL1, DL2, and DL3. The flip-flop FFT3 changes its output (data at point B3') to "High" level in synch with the rising edge #2 of the clock CLK.

The comparator CMP3 compares the data at point C' and the data at point B3'. Because the data at point C' and the data at point B3' are out of phase for a period from the rising edge #1 to the rising edge #2 of the clock CLK, the comparison result signal DS3 becomes "Low" level during this period.

As implied above, the semiconductor device of the present embodiment has the same advantageous effects as is the case for the first embodiment.

Besides, according to the present embodiment, it is possible to detect a severity level of malfunction by providing a plurality of delay circuits. For example, when it has been detected by the comparator CMP 1 that both data are out of phase, the main CPU core may alert a user that there is a possibility of malfunction. When it has been detected by the comparator CMP 2 that both data are out of phase, the main CPU core may alert a user that there is a high possibility of malfunction. When it has been detected by the comparator CMP 3 that both data are out of phase, the main CPU core may stop supplying the power supply voltage.

Third Embodiment

Figure 16:
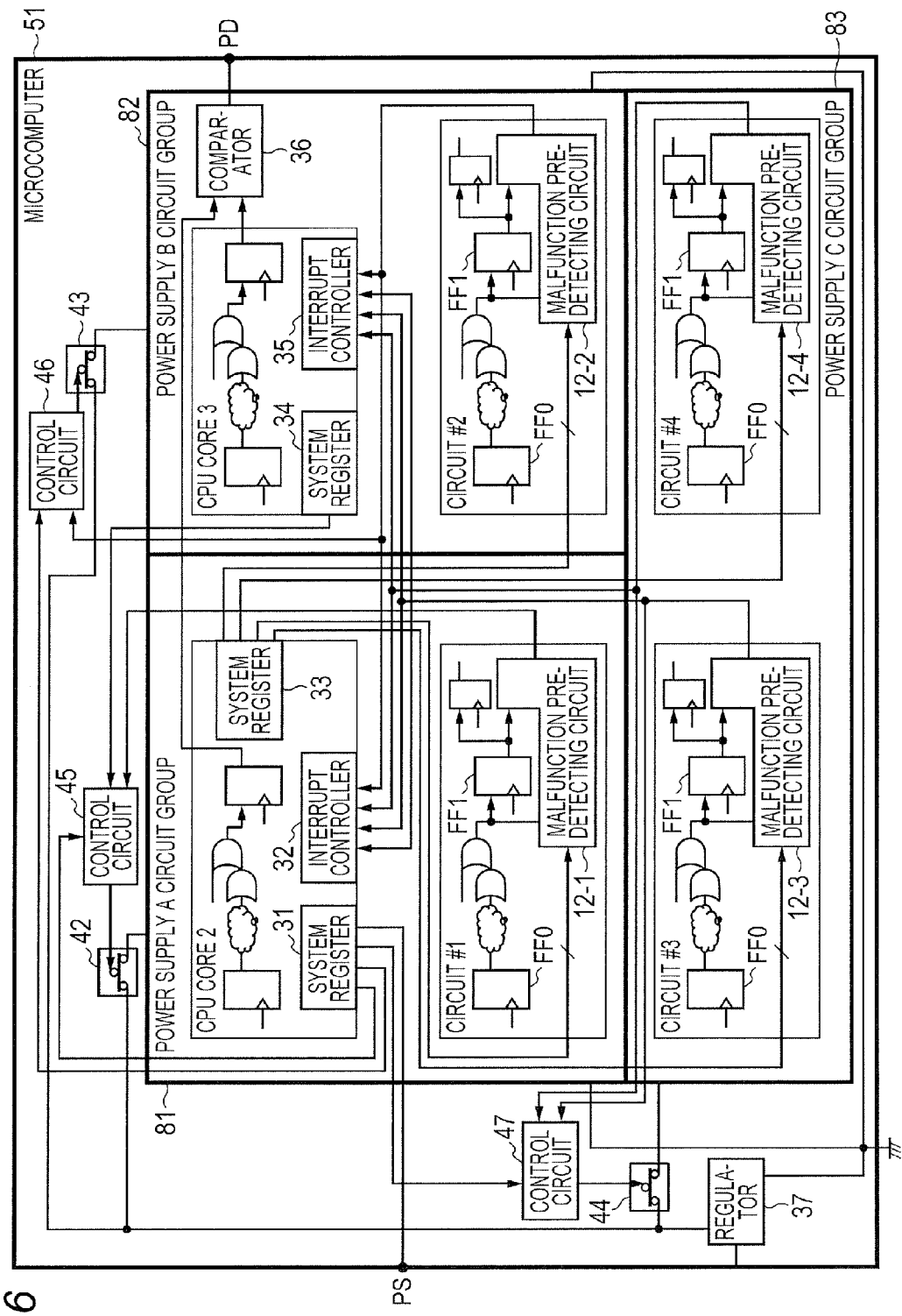
FIG. 16 is a diagram depicting a configuration of a microcomputer of a third embodiment.

FIG. 16 is a diagram depicting a configuration of a microcomputer 51 of a third embodiment.

The microcomputer 51 of FIG. 16 differs from the microcomputer 1 of FIG. 4 in the following respects.

A comparison result signal DS from a malfunction pre-detecting circuit 12-1 in a circuit #1 is sent to an interrupt controller 32 within the main CPU core 2 and an interrupt controller 35 within the CPU core 3 for checking and is also sent to a control circuit 45. When the comparison result signal DS has become "Low" level, the control circuit 45 recognizes having been notified of an interrupt signifying a malfunction risk and turns the power supply A switch 42 off.

A comparison result signal DS from a malfunction pre-detecting circuit 12-2 in a circuit #2 is sent to the interrupt controller 32 within the main CPU core 2 and the interrupt controller 35 within the CPU core 3 for checking and is also sent to a control circuit 46. When the comparison result signal DS has become "Low" level, the control circuit 46 recognizes having been notified of an interrupt signifying a malfunction risk and turns the power supply B switch 43 off.

A comparison result signal DS from a malfunction pre-detecting circuit 12-3 in a circuit #3 and a malfunction pre-detecting circuit 12-4 in a circuit #4 is sent to the interrupt controller 32 within the main CPU core 2 and the interrupt controller 35 within the CPU core 3 for checking and is also sent to a control circuit 47. When the comparison result signal DS has become "Low" level, the control circuit 47 recognizes having been notified of an interrupt signifying a malfunction risk and turns the power supply C switch 44 off.

As implied above, the semiconductor device of the present embodiment has the same advantageous effects as is the case for the first embodiment. Besides, in case a malfunction risk has occurred, the appropriate power supply switch is turned off by the appropriate control circuit without intervention of the CPU cores. Thus, the power supply switches can be controlled appropriately, even in a case where any of the CPU cores behaves abnormally due to temperature rise or the like.

Fourth Embodiment

Figure 17:
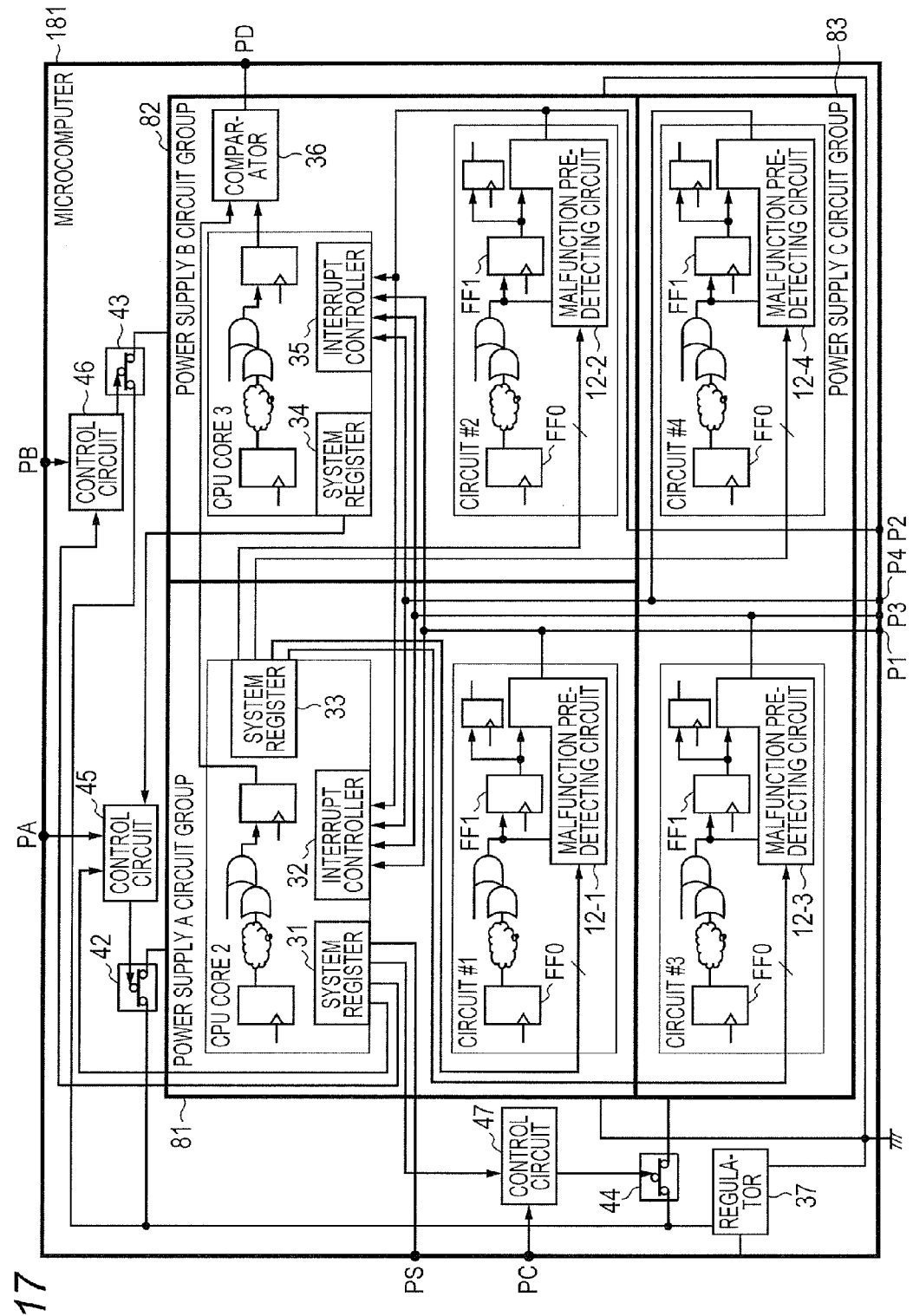
FIG. 17 is a diagram depicting a configuration of a microcomputer of a fourth embodiment.

FIG. 17 is a diagram depicting a configuration of a microcomputer 181 of a fourth embodiment.

The microcomputer 181 of FIG. 17 differs from the microcomputer 1 of FIG. 4 in the following respects.

A comparison result signal DS from a malfunction pre-detecting circuit 12-1 in a circuit #1 is sent to an interrupt controller 32 within the main CPU core 2 and an interrupt controller 35 within the CPU core 3 for checking and is also sent to a system external to the microcomputer 181 via a terminal P1.

A comparison result signal DS from a malfunction pre-detecting circuit 12-2 in a circuit #2 is sent to the interrupt controller 32 within the main CPU core 2 and the interrupt controller 35 within the CPU core 3 for checking and is also sent to the system external to the microcomputer 181 via a terminal P2.

A comparison result signal DS from a malfunction pre-detecting circuit 12-3 in a circuit #3 is sent to the interrupt controller 32 within the main CPU core 2 and the interrupt controller 35 within the CPU core 3 for checking and is also sent to the system external to the microcomputer 181 via a terminal P3.

A comparison result signal DS from a malfunction pre-detecting circuit 12-4 in a circuit #4 is sent to the interrupt controller 32 within the main CPU core 2 and the interrupt controller 35 within the CPU core 3 for checking and is also sent to the system external to the microcomputer 181 via a terminal P4.

When the comparison result signal DS from the malfunction pre-detecting circuit 12-1 in the circuit #1 has become "Low" level, the system external to the microcomputer 181 recognizes having been notified of an interrupt signifying a malfunction risk and sends a switching signal to a control circuit 45 via a terminal PA. If the switching signal to the control circuit 45 is "Low" level, the control circuit 45 turns the power supply A switch 42 off. If the switching signal to the control circuit 45 is "High" level, the control circuit 45 turns the power supply A switch 42 on.

When the comparison result signal DS from the malfunction pre-detecting circuit 12-2 in the circuit #2 has become "Low" level, the system external to the microcomputer 181 recognizes having been notified of an interrupt signifying a malfunction risk and sends a switching signal to a control circuit 46 via a terminal PB. If the switching signal to the control circuit 46 is "Low" level, the control circuit 46 turns the power supply B switch 43 off. If the switching signal to the control circuit 46 is "High" level, the control circuit 46 turns the power supply B switch 43 on.

When the comparison result signal DS from the malfunction pre-detecting circuit 12-3 in the circuit #3 has become "Low" level or when the comparison result signal DS from the malfunction pre-detecting circuit 12-4 in the circuit #4 has become "Low" level, the system external to the microcomputer 181 recognizes having been notified of an interrupt signifying a malfunction risk and sends a switching signal to a control circuit 47 via a terminal PC. If the switching signal to the control circuit 47 is "Low" level, the control circuit 47 turns the power supply C switch 44 off. If the switching signal to the control circuit 47 is "High" level, the control circuit 47 turns the power supply C switch 44 on.

As implied above, the semiconductor device of the Present embodiment has the same advantageous effects as is the case for the first embodiment. Besides, in case a malfunction risk has occurred, the appropriate power supply switch is turned off by control of the external system. Thus, the power supply switches can be controlled appropriately, even in a case where any of the CPU cores behaves abnormally due to temperature rise or the like.

While the invention made by the present inventors has been described specifically based on its embodiments hereinbefore, it will be obvious that the present invention is not limited to the described embodiments and various modifications may be made therein without departing from the scope of the invention.

What is claimed is:

1. A semiconductor device comprising:
   a first flip-flop;
   a second flip-flop which is provided in a subsequent stage of the first flip-flop; and
   a malfunction pre-detecting circuit provided on a route branching off from a route to a data input terminal of the second flip-flop,
   the malfunction pre-detecting circuit comprising:
   a delay element to delay input data that is input in parallel to the data input terminal of the second flip-flop;
   a third flip-flop that receives output of the delay element; and
   a comparator that compares output of the second flip-flop and output of the third flip-flop,
   wherein first test data and second test data are input to the malfunction pre-detecting circuit in an operation test mode for testing operation of the malfunction pre-detecting circuit and the second test data is input to the delay element,
   wherein the comparator compares the first test data and output of the third flip-flop in the operation test mode, and
   wherein the malfunction pre-detecting circuit further comprises:
   a first selector that outputs said second test data to the delay element in the operation test mode and outputs said input data to the delay element in usual operation mode; and
   a second selector that outputs said first test data to the comparator in the operation test mode and outputs the output of the second flip-flop to the comparator in the usual operation mode.

2. The semiconductor device according to claim 1, wherein the semiconductor device comprises a switch for stopping power supply to the first flip-flop and the second flip-flop, if both compared by the comparator are out of phase.

3. The semiconductor device according to claim 2, wherein the semiconductor device comprises a plurality of circuit blocks, each operating on a separate power supply voltage, and
   wherein the switch stops power supply to a circuit block including the first flip-flop and the second flip-flop, if both compared by the comparator are out of phase.

4. The semiconductor device according to claim 3, wherein the semiconductor device is a microcomputer of dual core lockstep architecture, comprising:
   a first CPU core;
   a second CPU core; and
   a comparator that compares a result of computation by the first CPU core and a result of computation by the second CPU core.

5. The semiconductor device according to claim 4, wherein an interrupt is notified to the first CPU core and the second CPU core, if both compared by the comparator are out of phase, and
   wherein the first CPU core controls the switch to stop power supply.

6. The semiconductor device according to claim 3, wherein a signal representing a comparison result of the comparator is sent directly to the switch to stop the power supply.

7. The semiconductor device according to claim 3, wherein a signal representing a comparison result of the comparator is sent to an entity external to the semiconductor device and the power supply is caused to stop by control of the external entity.

8. A semiconductor device comprising:
   a first flip-flop;
   a second flip-flop which is provided in a subsequent stage of the first flip-flop; and a malfunction pre-detecting circuit provided on a route branching off from a route to a data input terminal of the second flip-flop, the malfunction pre-detecting circuit comprising:

a plurality of stages of delay elements coupled in series to delay input data that is input in parallel to the data input terminal of the second flip-flop;

a plurality of third flip-flops, each receiving output of each delay element;

a plurality of comparators, each comparing output of the second flip-flop and output of a third flip-flop linked thereto, wherein first test data and second test data are input to the malfunction pre-detecting circuit in an operation test mode for testing operation of the malfunction pre-detecting circuit and the second test data is input to a first stage of the stages of delay elements, wherein the comparators each compare the first test data and output of the third flip-flop linked thereto in the operation test mode, and wherein the malfunction pre-detecting circuit further comprises:

a first selector that outputs said second test data to the delay elements in the operation test mode and outputs said input data to the delay elements in usual operation mode; and a second selector that outputs said first test data to the comparators in the operation test mode and outputs the output of the second flip-flop to the comparators in the usual operation mode.

9. The semiconductor device according to claim 8, wherein the comparators each determine a malfunction risk based on an increased delay of signal transmission from a preceding stage and a following stage.

10. The semiconductor device according to claim 1, wherein the comparator determines a malfunction risk based on an increased delay of signal transmission from a preceding stage and a following stage.

11. A semiconductor device comprising:

a first flip-flop;

a second flip-flop which is provided in a subsequent stage of the first flip-flop; and a malfunction pre-detecting circuit provided on a route branching off from a route to a data input terminal of the second flip-flop, the malfunction pre-detecting circuit comprising:

a delay element to delay input data that is input in parallel to the data input terminal of the second flip-flop;

a third flip-flop that receives output of the delay element; and a comparator that compares output of the second flip-flop and output of the third flip-flop, wherein first test data and second test data are input to the malfunction pre-detecting circuit in an operation test mode for testing operation of the malfunction pre-detecting circuit and the second test data is input to the delay element, and wherein the comparator compares the first, test data and output of the third flip-flop in the operation test mode and determines a malfunction risk based on an increased delay of signal transmission from a preceding stage and a following stage.

12. The semiconductor device according to claim 11, wherein the malfunction pre-detecting circuit comprises:

a first selector that outputs said second test data to the delay element in the operation test mode and outputs said input data to the delay element in usual operation mode; and a second selector that outputs said first test data to the comparator in the operation test mode and outputs the output of the second flip-flop to the comparator in the usual operation mode.

13. The semiconductor device according to claim 12, wherein the semiconductor device comprises a switch for stopping power supply to the first flip-flop and the second flip-flop, if both compared by the comparator are out of phase.

14. The semiconductor device according to claim 13, wherein the semiconductor device comprises a plurality of circuit blocks, each operating on a separate power supply voltage, and wherein the switch stops power supply to a circuit block including the first flip-flop and the second flip-flop, if both compared by the comparator are out of phase.

15. The semiconductor device according to claim 14, wherein the semiconductor device is a microcomputer of dual core lockstep architecture, comprising:

a first CPU core;

a second CPU core; and a comparator that compares a result of computation by the first CPU core and a result of computation by the second CPU core.

16. The semiconductor device according to claim 15, wherein an interrupt is notified to the first CPU core and the second CPU core, if both compared by the comparator are out of phase, and wherein the first CPU core controls the switch to stop power supply.

17. The semiconductor device according to claim 14, wherein a signal representing a comparison result of the comparator is sent directly to the switch to stop the power supply.

18. The semiconductor device according to claim 14, wherein a signal representing a comparison result of the comparator is sent to an entity external to the semiconductor device and the power supply is caused to stop by control of the external entity.

* * * * *